(12) United States Patent
Lee et al.

(10) Patent No.: US 10,196,738 B2
(45) Date of Patent: Feb. 5, 2019

(54) DEPOSITION PROCESS MONITORING SYSTEM, AND METHOD OF CONTROLLING DEPOSITION PROCESS AND METHOD OF FABRICATING SEMICONDUCTOR DEVICE USING THE SYSTEM

(71) Applicant: Samsung Electronics Co., Ltd., Suwon-si (KR)

(72) Inventors: Chang-yun Lee, Hwaseong-si (KR); Ju-hyun Lee, Suwon-si (KR); Kee-soo Park, Hwaseong-si (KR); Kyu-hee Han, Seongnam-si (KR); Seung-hun Lee, Hwaseong-si (KR); Byung-chul Jeon, Yongin-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 63 days.

(21) Appl. No.: 15/407,129

(22) Filed: Jan. 16, 2017

(65) Prior Publication Data

US 2018/0010243 A1   Jan. 11, 2018

(30) Foreign Application Priority Data

Jul. 6, 2016 (KR) ........................ 10-2016-0085597

(51) Int. Cl.
*C23C 14/58* (2006.01)
*C23C 16/455* (2006.01)
(Continued)

(52) U.S. Cl.
CPC .......... *C23C 14/5813* (2013.01); *C23C 16/24* (2013.01); *C23C 16/4401* (2013.01);
(Continued)

(58) Field of Classification Search
CPC ... C23C 14/5813; C23C 16/455; C23C 16/56; C23C 16/24; C23C 16/4401;
(Continued)

(56) References Cited

U.S. PATENT DOCUMENTS 5,177,364 A   1/1993   Gowlett et al.
5,288,364 A   2/1994   Burt et al.
(Continued)

FOREIGN PATENT DOCUMENTS

JP   11-140655       5/1999
JP   2002-069648     3/2002
KR   10-1356166      1/2014

*Primary Examiner* — Tri T Ton
(74) *Attorney, Agent, or Firm* — Muir Patent Law, PLLC

(57) ABSTRACT

Provided are a deposition process monitoring system capable of detecting an internal state of a chamber in a deposition process, and a method of controlling the deposition process and a method of fabricating a semiconductor device using the system. The deposition process monitoring system includes a facility cover configured to define a space for a deposition process, a chamber located in the facility cover, covered with a translucent cover dome, and having a support on which a deposition target is placed, a plurality of lamps disposed in the facility cover, the lamps respectively disposed above and below the chamber, the lamps configured to supply radiant heat energy into the chamber during the deposition process, and a laser sensor disposed outside the chamber, the laser sensor configured to irradiate the cover dome with a laser beam and detect an intensity of the laser beam transmitted through the cover dome, wherein a state of by-products with which the cover dome is coated is determined based on the detected intensity of the laser beam.

20 Claims, 22 Drawing Sheets

(51) Int. Cl.
*C23C 16/56* (2006.01)
*H01L 21/02* (2006.01)
*H01L 21/67* (2006.01)
*H01L 21/78* (2006.01)
*H01L 21/66* (2006.01)
*C23C 16/24* (2006.01)
*C23C 16/44* (2006.01)
*C23C 16/52* (2006.01)

(52) U.S. Cl.
CPC ............ *C23C 16/455* (2013.01); *C23C 16/52* (2013.01); *C23C 16/56* (2013.01); *H01L 21/0206* (2013.01); *H01L 21/02266* (2013.01); *H01L 21/02271* (2013.01); *H01L 21/67253* (2013.01); *H01L 21/78* (2013.01); *H01L 22/26* (2013.01)

(58) Field of Classification Search
CPC ................. C23C 16/52; H01L 21/0206; H01L 21/02266; H01L 21/02271; H01L 21/67253; H01L 21/78; H01L 22/26; H01L 21/02052; H01L 21/0228
See application file for complete search history.

(56) References Cited

U.S. PATENT DOCUMENTS

| | | | |
|---|---|---|---|
| 5,923,429 A | 7/1999 | Takeuchi | |
| 5,985,032 A | 11/1999 | Eriguchi | |
| 6,083,323 A | 7/2000 | Carlson et al. | |
| 6,784,445 B2 | 8/2004 | Ziegler | |
| 7,175,875 B2* | 2/2007 | Nakano | C23C 14/564 134/1.1 |
| 2003/0052083 A1* | 3/2003 | Kim | C23C 16/4401 216/59 |
| 2015/0128860 A1* | 5/2015 | Canizares | C30B 25/16 118/712 |

\* cited by examiner

DEPOSITION PROCESS MONITORING SYSTEM, AND METHOD OF CONTROLLING DEPOSITION PROCESS AND METHOD OF FABRICATING SEMICONDUCTOR DEVICE USING THE SYSTEM

CROSS-REFERENCE TO RELATED APPLICATION

This application claims the benefit of priority under 35 U.S.C. 119 to Korean Patent Application No. 10-2016-0085597, filed on Jul. 6, 2016, in the Korean Intellectual Property Office, the disclosure of which is incorporated herein in its entirety by reference.

BACKGROUND

1. Field

The disclosure relates to a semiconductor device fabricating apparatus and a method of fabricating a semiconductor device, for example, to an apparatus for monitoring an internal state of a chamber in a deposition process and a method of fabricating a semiconductor device using the apparatus.

2. Description of the Related Art

Generally, semiconductor devices are fabricated through a semiconductor device fabricating process including a thin film process, a photolithography process, an etching process, a diffusion process, and the like. Here, the thin film process, for example, a deposition process, may be performed through a physical vapor deposition (PVD) method or a chemical vapor deposition (CVD) method. Recently, a CVD method in which step coverage, uniformity, and mass production of a thin film are excellent is often being used. In a deposition process, cleaning for removing by-products with which an inside of the chamber is coated is performed, and the cleaning is periodically performed through a dry cleaning method mainly using a cleaning gas. In certain processes, since the inside of the chamber cannot be completely cleaned using only the dry cleaning method, a wet cleaning method in which a chamber is disassembled and is directly cleaned by an operator using a cleaning solution is performed.

SUMMARY

The inventive concept provides a deposition process monitoring system capable of accurately detecting an internal state of a chamber in a deposition process, and a method of controlling the deposition process and a method of fabricating a semiconductor device using the system.

According to an aspect of the inventive concept, there is provided a deposition process monitoring system including a facility cover defining a space for a deposition process, a chamber located in the facility cover, the chamber defined by a transparent cover dome, the chamber having a support in the chamber, and the chamber configured to receive a deposition target, a plurality of lamps disposed in the facility cover, the lamps respectively disposed at an upper portion and a lower portion of the chamber, and the lamps configured to supply radiant heat energy into the chamber during a deposition process, and a first laser sensor disposed outside the chamber, the first laser sensor configured to irradiate the cover dome with a laser beam and detect an intensity of the laser beam transmitted through the cover dome, wherein the monitoring system is configured to determine a state of by-products coated on the cover dome based on the detected intensity of the laser beam.

According to another aspect of the inventive concept, there is provided a deposition process monitoring system including a chamber covered by a transparent cover dome, a support disposed in the chamber, the support configured to receive a deposition target, a plurality of lamps respectively disposed above and below the chamber, the lamps configured to supply radiant heat energy into the chamber in a deposition process, and a sensor unit including at least one of a horizontal type laser sensor and a vertical type laser sensor, wherein the horizontal type laser sensor is disposed outside the chamber, and configured to horizontally irradiate an upper surface of the cover dome with a laser beam and detect an intensity of the laser beam transmitted through the cover dome, wherein the vertical type laser sensor is disposed outside the chamber, and configured to vertically irradiate the upper surface of the deposition target with the laser beam and detect the intensity of the laser beam transmitted through the cover dome, and wherein the deposition process monitoring system is configured to determine a state of by-products coated on the cover dome based on a detected intensity of the laser beams.

According to still another aspect of the inventive concept, there is provided a method of controlling a deposition process including disposing a deposition target on a support disposed in a chamber covered by a transparent cover dome, injecting a process gas into the chamber, supplying radiant heat energy into the chamber by lamps disposed outside the chamber, irradiating the chamber with a laser beam and detecting an intensity of the laser beam transmitted through the cover dome, determining a state of by-products coated on the cover dome based on the detected intensity of the laser beam; and adjusting a process condition according to the state of the by-products.

According to yet another aspect of the inventive concept, there is provided a method of fabricating a semiconductor device including disposing a wafer on a support disposed in a chamber covered by a transparent cover dome, injecting a process gas into the chamber, supplying radiant heat energy into the chamber by lamps disposed outside the chamber and growing a thin film on the wafer, irradiating the chamber with a laser beam and detecting an intensity of the laser beam transmitted through the cover dome, determining a state of by-products coated on the cover dome based on the detected intensity of the laser beam, determining whether the state of the by-products is within an allowable range, and performing a subsequent semiconductor process on the wafer when the state of the by-products is within the allowable range.

According to an aspect of the present disclosure, a method of manufacturing a semiconductor device comprises disposing a substrate on a support of a chamber of an apparatus, providing a gas into the chamber, forming a layer on the substrate with the gas, monitoring by-product formed on a cover of the chamber, and adjusting the apparatus based on the monitored states of the by-product, wherein the chamber is disposed in a first cover, wherein the chamber comprises a transparent cover, wherein monitoring the by-product comprises irradiating a first laser beam on the transparent cover of the chamber, receiving the first laser beam transmitted through the transparent cover, determining a state of the by-product formed on the transparent cover based on the intensity of the received first laser beam.

BRIEF DESCRIPTION OF THE DRAWINGS

Embodiments of the inventive concept will be more clearly understood from the following detailed description taken in conjunction with the accompanying drawings in which.

DETAILED DESCRIPTION

Figure 1:
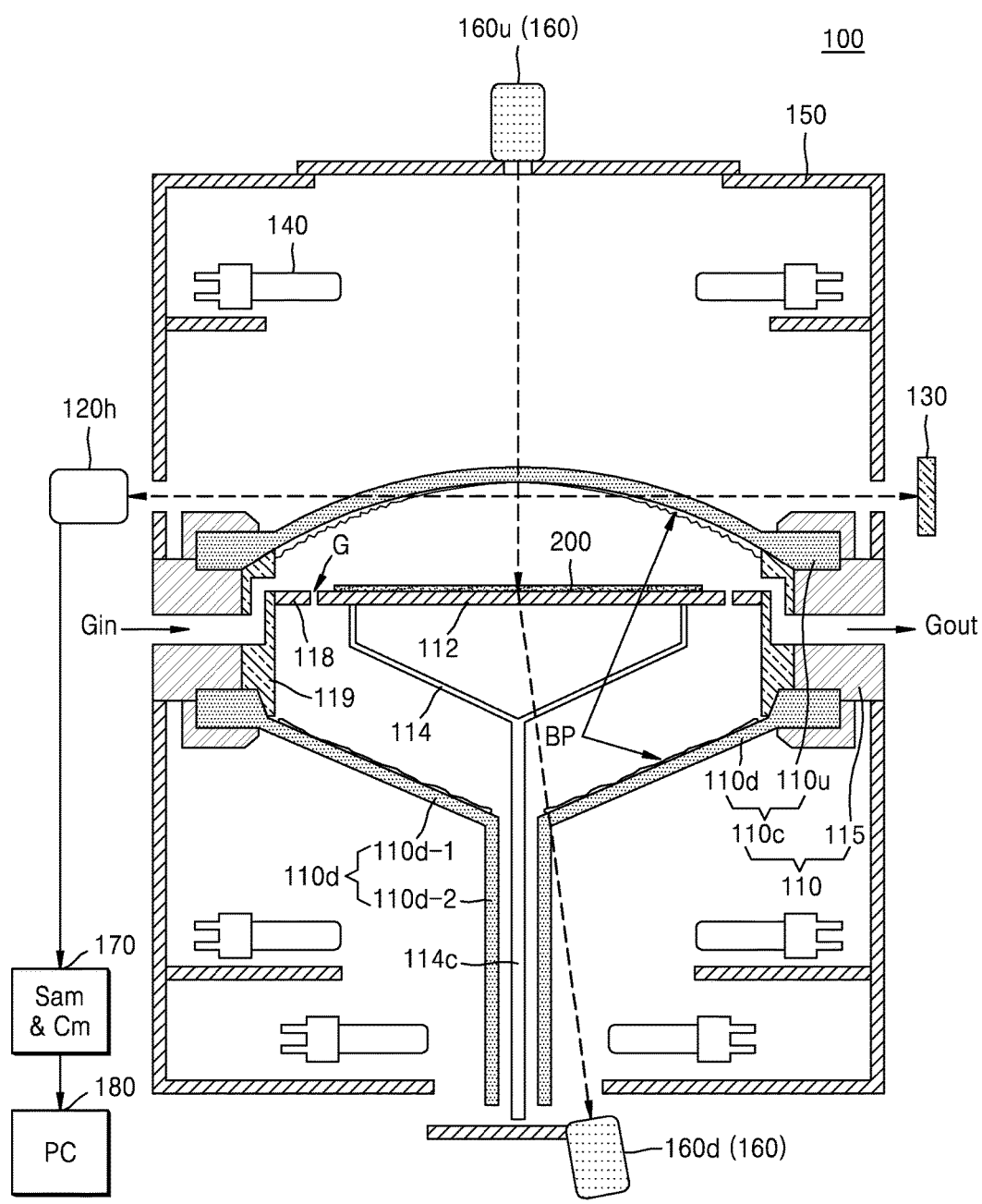
FIG. 1 is a cross-sectional view schematically illustrating a deposition process monitoring system according to one embodiment of the inventive concept.

Hereinafter, example embodiments will be explained in detail with reference to the accompanying drawings, in which various embodiments are shown. The invention may, however, be embodied in many different forms and should not be construed as limited to the example embodiments set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, like numbers refer to like elements throughout. Though the different figures show various features of exemplary embodiments, these figures and their features are not necessarily intended to be mutually exclusive from each other. Rather, certain features depicted and described in a particular figure may also be implemented with embodiment(s) depicted in different figure(s), even if such a combination is not separately illustrated. Referencing such features/figures with different embodiment labels (e.g. "first embodiment") should not be interpreted as indicating certain features of one embodiment are mutually exclusive of and are not intended to be used with another embodiment.

Unless the context indicates otherwise, the terms first, second, third, etc., are used as labels to distinguish one element, component, region, layer or section from another element, component, region, layer or section (that may or may not be similar). Thus, a first element, component, region, layer or section discussed below in one section of the specification (or claim) may be referred to as a second element, component, region, layer or section in another section of the specification (or another claim).

It will be understood that when an element is referred to as being "connected," "coupled to" or "on" another element, it can be directly connected/coupled to/on the other element or intervening elements may be present. In contrast, when an element is referred to as being "directly connected" or "directly coupled" to another element, or as "contacting" or "in contact with" another element, there are no intervening elements present. Spatially relative terms, such as "beneath," "below," "lower," "above," "upper" and the like, may be used herein for ease of description to describe one element's or feature's positional relationship relative to another element(s) or feature(s) as illustrated in the figures. It will be understood that such spatially relative terms are intended to encompass different orientations of the device in use or operation in addition to the orientation depicted in the figures. Thus, a device depicted and/or described herein to have element A below element B, is still deemed to have element A below element B no matter the orientation of the device in the real world.

Embodiments may be illustrated herein with idealized views (although relative sizes may be exaggerated for clarity). It will be appreciated that actual implementation may vary from these exemplary views depending on manufacturing technologies and/or tolerances. Therefore, descriptions of certain features using terms such as "same," "equal," and geometric descriptions such as "planar," "coplanar," "cylindrical," "square," etc., as used herein when referring to orientation, layout, location, shapes, sizes, amounts, or other measures, do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise.

Unless otherwise defined, all terms (including technical and scientific terms) used herein have the same meaning as commonly understood by one of ordinary skill consistent with their meaning in the context of the relevant art and/or the present application.

FIG. 1 is a cross-sectional view schematically illustrating a deposition process monitoring system according to one embodiment of the inventive concept.

Referring to FIG. 1, a deposition process monitoring system 100 in the present embodiment may include a chamber 110, a laser sensor 120h, a reflection plate 130, lamps 140, a facility cover 150, a pyrometer 160, a sensor amplification and communication module 170, and an analysis and control computer 180. The deposition process monitoring system 100 may be a deposition machine or a deposition apparatus equipped with monitoring functions.

The chamber 110 may include a chamber body 115 and a cover dome 110c. The chamber 110 may be a deposition chamber for growing a thin film on a deposition target, for example, a substrate such as a wafer 200. For example, the chamber 110 may be a chamber for epitaxial growth or selective epitaxial growth (SEG), and may be a low pressure chemical vapor deposition (LPCVD) chamber or a very low pressure chemical vapor deposition (VLPCVD) chamber. However, the chamber 110 is not limited to the above-described chambers.

The chamber body 115 may have a cylindrical shape having open upper and lower portions. For example, the chamber body 115 may have a general ring shape. However, the shape of the chamber body 115 is not limited thereto. For example, the chamber body 115 may have a polygonal cylindrical shape. A portion or all of the chamber body 115 may be formed of a metallic material. For example, the chamber body 115 may be formed of a metallic material such as aluminum or stainless steel.

The cover dome 110c may include an upper dome 110u and a lower dome 110d. The upper dome 110u may be disposed above the chamber body 115 and may have a dome shape which is convex and faces upward. For example, the upper dome 110u may have a dome shape that protrudes upwardly. A lower portion of the upper dome 110u, for example, an edge portion thereof, may be attached to an upper surface of the chamber body 115 to limitedly close an upper region of a reaction space in the chamber 110. The upper dome 110u may be attached to the chamber body 115 to have a detachable structure. Accordingly, the upper dome 110u may be cleaned by being separated from the chamber body 115, or replaced with a new upper dome. For example, the upper dome 110u may be detached from the chamber body 115 when the upper dome 110u is cleaned.

The upper dome 110u may be formed of a material which may effectively transfer radiant heat energy from the lamps 140 provided above the chamber 110 to the reaction space in the chamber 110. For example, the upper dome 110u may be formed of a translucent material or a transparent material such as quartz which is transparent to ultraviolet (UV), visible light, and infrared (IR). Of course, the material of the upper dome 110u is not limited to quartz. For example, the upper dome 110u may be formed of a translucent ceramic. For example, at least one portion of the upper dome 110u may be formed of a non-translucent material. For example, a portion of the upper dome 110u may be formed of an opaque material. Since the upper dome 110u is formed of a translucent material or a transparent material, the radiant heat energy from the lamps 140 may be transmitted through the upper dome 110u and transferred to the reaction space in the chamber 110.

The lower dome 110d may be attached to a lower surface of the chamber body 115 to limitedly close a lower region of the reaction space in the chamber 110. The lower dome 110d may be formed of a translucent material or a transparent material such as quartz. Accordingly, the lower dome 110d may effectively transfer the radiant heat energy from the lamps 140 disposed below the chamber 110 to the reaction space in the chamber 110. For example, the lower dome 110d may be formed of a translucent ceramic. For example, at least one portion of the lower dome 110d may be formed of a non-translucent material like the upper dome 110u. For example, a portion of the lower dome 110d may be formed of an opaque material.

The lower dome 110d may include a bottom plate 110d-1 which is downwardly inclined and an extended pipe 110d-2 which protrudes and extends from the center of the bottom plate 110d-1 downwardly as illustrated in FIG. 1. The bottom plate 110d-1 may have a reversed conical shape having an open upper portion. The extended pipe 110d-2 may have a cylindrical shape. For example, the lower dome 110d may have a funnel shape having a conical portion 110d-1 and a narrow stem portion 110d-2. For example, the lower dome 110d may have an upside-down dome shape having a pipe 110d-2 on its bottom.

A support 112 may be disposed at a central portion of the chamber 110, and the support 112 may be supported by a tripod or a hexapod 114. The support 112 may be configured to receive a deposition target, for example, a substrate including a wafer 200. For example, a deposition target may be placed on the support 112 during a deposition process. It will be appreciated that the substrate may be any one of the monolithic structures resulting from one of the many stages of a semiconductor manufacturing process (including intermediate stages and intermediate structures), and may comprise an initial substrate (e.g., semiconductor wafer) or a structure substantially the same as the final semiconductor device(s) formed within and/or on such an initial structure. A central shaft 114c of the tripod or the hexapod 114 may extend downward through the extended pipe 110d-2, and may be connected to a drive for rotation (not illustrated). For example, the support 112 may be rotated by the drive. For example, the support may be rotated with a constant velocity. For example, the constant velocity may be a constant angular velocity. The support 112 may be a susceptor. For example, the support 112 may convert electromagnetic energy to heat.

A preheating ring 118 may be disposed at an outside of the support 112. For example, the preheating ring 118 may surround the support. An insert 119 such as a quartz ring may be disposed at an inner side surface of the chamber body 115 to be adjacent to the support 112. The insert 119 may form a portion of the chamber body 115. A gap G may be present between the preheating ring 118 and the support 112 as illustrated in FIG. 1, and process gases may be moved to the reaction space below the support 112 through the gap G.

An inner surface of the cover dome 110c may be coated with by-products BP. For example, in a deposition process, a thin film may not be formed only on the wafer 200 which is a deposition target, but an inner surface in the vicinity thereof may also be coated with a thin film. For example, by-products may be deposited on the inner surface. For example, the by-products BP may be coated on the inner surface of the cover dome 110c of a quartz material, and the by-products BP may reduce the transmission of the radiant heat energy from the lamps 140. For example, the by-products BP may vary according to a type of the thin film formed on the wafer. For example, in order to epitaxially grow silicon (Si) on the wafer 200, a silicon source gas such as $SiH_4$, $Si_2H_6$, $SiCl_2H_2$, $SiCl_3H$, or $SiCl_4$ may be used, and the inner surface of the cover dome 110c may be coated with a silicon compound containing silicon as by-products BP. Of course, the inventive concept is not limited to Si, and various thin films such as SiGe, SiC, SiGeC, and the like may be epitaxially grown on the wafer 200, and corresponding by-products BP may be coated on an inner surface of the cover dome 110c.

A pressure adjusting apparatus, a pressure measuring apparatus, and various types of testing or monitoring apparatuses may be installed in and out of the chamber 110 to check an internal state of the chamber 110. The laser sensor 120h and the pyrometer 160 may be included in a monitoring apparatus, and they will be described below. A gas inlet Gin and a gas outlet Gout may be connected to the chamber 110. Process gases may be introduced into the chamber 110 through the gas inlet Gin. Unreacted gases and/or impurities formed by a reaction may be exhausted or removed from the chamber 110 through the gas outlet Gout. For example, the gas inlet Gin and the gas outlet Gout may be formed in the chamber body 115. The gas inlet Gin and the gas outlet Gout may be disposed at sides opposite to each other. However, the positions of the gas inlet Gin and the gas outlet Gout are not limited thereto.

The laser sensor 120h may be disposed on an outer side surface of the facility cover 150. The laser sensor 120h may irradiate the cover dome 110c, for example, the upper dome 110u with a laser beam to detect an intensity of the laser beam transmitted through the upper dome 110u. For example, the laser sensor 120h may be a horizontal type laser sensor which horizontally irradiates the upper dome 110u on a surface above the wafer 200 which is a measurement target with a laser beam as indicated by a dashed arrow, and may detect the intensity of the laser beam by receiving the laser beam reflected by the reflection plate 130. In the deposition process monitoring system 100 of the present embodiment, the laser sensor 120h is disposed above the chamber body 115 so that the laser beam is transmitted through the upper dome 110u, but the position of the laser sensor 120h is not limited thereto. For example, the laser sensor 120h may be disposed below the chamber body 115 so that the laser beam is transmitted through the lower dome 110d. A structure and a function of the laser sensor 120h will be described in more detail in the description of FIGS. 2 to 3C.

The reflection plate 130 may be disposed on the outer side surface of the facility cover 150, and may be disposed on a side surface of the facility cover 150 opposite to the laser sensor 120h with respect to the chamber 110. For example, the reflection plate 130 may be disposed at a position to which a laser beam comes from the laser sensor 120h so that the laser beam is reflected on the reflection plate 130. The reflection plate 130 may be formed of plastic having an excellent reflective characteristic. For example, the reflection plate 130 may have a high reflectance. Of course, the material of the reflection plate 130 is not limited to plastic. For example, the reflection plate 130 may be formed of a material such as a metal.

In the deposition process monitoring system 100 of the present embodiment, the reflection plate 130 may have a retro-reflective characteristic. For example, the reflection plate 130 may be a retroreflector. The retro-reflector may be a reflector that reflects incident light back to a direction where a light source is positioned. For example, the reflection plate 130 may send back the incident light in a direction where the light source is positioned by reflecting the light regardless of incident angles. For example, the reflection plate 130 may reflect and send back the laser beam to the laser sensor 120h. For example, the reflection plate 130 may be formed to have a structure in which a fabric or a film is uniformly covered and coated with fine glass beads to form a retroreflector. For another example, the reflection plate 130 may have a micro-prism structure in which a polymer film is coated with micro-prism having a cube shape to form a retroreflector.

The reflection plate 130 may reflect incident light by polarizing the incident light. For example, reflected light from the reflection plate 130 may be a polarized light. The polarized light may be a linearly polarized light or an elliptically polarized light. The polarization direction of the reflected light may be horizontal or vertical, or may have a predetermined angle with respect to a horizontal direction. For example, the reflection plate 130 may rotate polarization direction of the incident light by 90°. For example, the incident light and the reflected light may be linearly polarized, and the polarization directions, e.g. polarization axes, of the incident light and the reflected light may be perpendicular to each other. A polarization function of the reflection plate 130 may help the laser sensor 120h to effectively detect the laser beam. The polarization function of the reflection plate 130 will be described in more detail in the description of the laser sensor 120h of FIGS. 3A to 3C.

The reflection plate 130 may have both of the retro-reflection characteristic and the 90° polarization rotation characteristic, and alternatively, the reflection plate 130 may have any one of the retro-reflection characteristic and the 90° polarization rotation characteristic, or may simply reflect without either characteristic.

The lamps 140 may be disposed above and below the chamber 110. The lamps 140 may supply radiant heat energy used in the deposition process into the chamber 110. For example, the lamps 140 may be, for example, halogen lamps. A plurality of lamps 140 may be disposed above and below the chamber 110. For example, the lamps 140 may be disposed in the facility cover 150. For example, tens of the lamps 140 may be disposed respectively above and below the chamber 110 so that the heat energy emitted from the lamps 140 is enough to raise a temperature of the wafer 200 in the chamber 110, e.g., to increase the temperature of the wafer 200 up to 1,200° C. Although not illustrated, a plurality of lamp reflection plates may be disposed inside the facility cover 150 to have various shapes, and thus light emitted from the lamps 140 may be effectively supplied into the chamber 110.

In certain examples, the lamps 140 may include UV lamps. The UV lamp may be, for example, an Hg-based arc lamp. The UV lamp may function to sufficiently activate the above-described silicon source gas, HCl, $H_2$ gas, and the like rather than to increase the temperature in the chamber 110.

The facility cover 150, which is a type of housing, may support the chamber 110, and surround the chamber 110 so that the chamber 110 is blocked, protected, and/or isolated from the outside. The facility cover 150 may support the lamps 140 by accommodating the lamps 140 therein. Various components such as the laser sensor 120h, the reflection plate 130, the pyrometer 160, and the like may be attached to the facility cover 150, and the facility cover 150 may support these components.

The facility cover 150 may be formed of a metal material. However, the material of the facility cover 150 is not limited to a metal. View-ports may be installed in the facility cover 150 so as to view the inside of the chamber 110 from the outside, and the laser sensor 120h and the reflection plate 130 may be disposed at the view-port portions.

An upper pyrometer 160u may be disposed on an upper surface of the facility cover 150 and a lower pyrometer 160d may be disposed on a lower surface of the facility cover 150. Of course, the positions and the number of pyrometers 160 are not limited thereto. The pyrometers 160 may be non-contact optical pyrometers. An optical pyrometer may be used for measuring a temperature of a measure object by comparing a brightness of the measure object to a standard brightness of the lamp and/or by analyzing spectrum of light emitted from the measure object. An optical pyrometer may be used for measuring a temperature of a high-temperature body having a temperature of over 700° C., for example, the temperature of the high-temperature body into which a thermometer may not be directly inserted. However, the pyrometer 160 is not limited to optical pyrometers. For example, the pyrometer 160 may be a radiation pyrometer using radiant heat, or a photoelectric pyrometer using a photoelectric current generated by radiation.

The deposition process monitoring system 100 in the present embodiment may measure an internal temperature of the chamber 110 in a non-contact manner using the pyrometers 160 which are disposed on the upper and lower portions of the facility cover 150. When the pyrometer 160 uses light coming from inside of the chamber 110, the light inside the chamber 110 is transmitted through the cover dome 110c and to be accurately transferred to the pyrometer 160. However, when an inner surface of the cover dome 110c is coated with the by-products BP, the transmission of the light is impeded by the by-products BP and thus an error may be caused in the temperature measurement of the pyrometer 160. For example, the by-products BP coated on the inner surface of the cover dome 110c may reduce or disturb the transmission of light, and the temperature of a measure object in the chamber 110 may not be accurately measured by a pyrometer 160. A temperature condition in the deposition process may not be accurately maintained due to the error in the temperature measurement of the pyrometer 160, and thus a failure of the deposition process may occur. For example, the temperature in the chamber 110 may not be controlled properly because the pyrometer 160 may not measure accurate temperature, and therefore the chamber 110 may not perform a proper process.

However, the deposition process monitoring system 100 in the present embodiment includes the laser sensor 120h and checks a state of the by-products BP on the inner surface of the cover dome 110c in the deposition process in real time, and prevents or reduces temperature detection errors. Thus failure of the deposition process may be prevented or reduced beforehand by adjusting a process condition or by performing a temperature correction of the pyrometer 160 according to the state of the by-products BP. For example, the temperature in the chamber 110 may be adjusted by correctly detecting the chamber temperature with adjusted pyrometer 160.

For reference, in a conventional deposition facility, since there is no sensor which may detect the state of the by-products BP with which the inner surface of the cover dome 110c is coated, a failure of the deposition process is directly checked with the naked eye by separating the chamber 110, or a failure of the deposition process is checked by actually measuring the corresponding wafer after the deposition process is completed. However, the conventional method, checking the wafer with the naked eye or measuring the wafer, may be disadvantageous in terms of mass production of semiconductor devices because it takes longer time and costs are high.

The sensor amplification and communication module 170 may be electrically connected to the laser sensor 120h, and may receive a signal from the laser sensor 120h to amplify the signal. Here, the signal may be a signal with respect to the intensity of the laser beam detected from a light receiving unit 120h-R (see FIG. 3A) of the laser sensor 120h. The sensor amplification and communication module 170 may transmit the amplified signal to the outside via wired or wireless communication. Here, the outside may be, for example, the analysis and control computer 180.

The analysis and control computer 180 may be connected to the sensor amplification and communication module 170 via wired or wireless communication, and may receive the amplified signal therefrom. For example, the analysis and control computer 180 may analyze the received signal, and may generally control the deposition process monitoring system 100 based on an analyzed result.

The analysis and control computer 180 may determine, for example, whether the state of the by-products BP is within an allowable range by checking or monitoring the state of the by-products BP according to the detected intensity of the laser beam. For example, whether a thickness of the by-products BP is within an allowable range is determined by calculating the thickness of the by-products BP according to the detected intensity of the laser beam. For example, the analysis and control computer 180 may quantify the thickness of the by-products BP according to the detected intensity of the laser beam. For example, an intensity of a laser beam detected after the deposition process is performed for a certain amount of time may be expressed as a percentage with respect to an intensity of a laser beam detected in a state that the cover dome 110c is not coated with the by-products BP, e.g., a clean cover dome. Thicknesses of the by-products BP may be quantified according to the corresponding percentages. After the quantification is completed in this manner throughout a necessary range of percentage, the thickness of the by-products BP may be obtained by comparing a detected intensity of the laser beam with an intensity of an initial laser beam. For example, when an acceptable range of the thickness of the by-products BP is determined, whether the thickness of the by-products BP is within an acceptable range may be immediately determined through the above-described determination of the thickness.

In certain embodiments, the above-described checking may be performed with a concept of a state of a thin film on the wafer instead of a concept of the state of the by-products BP. For example, a thickness of the thin film may be calculated or quantified according to the detected intensity of the laser beam. For example, in the corresponding deposition process, whether the thickness of the thin film formed on a wafer 200 is within an acceptable range may be determined by an intensity of laser received by the light receiving unit 120h-R. However, the state of the by-products BP and the state of the thin film may be different from each other. For example, as the thickness of the by-products BP is increased, the detected intensity of the laser beam may be reduced, and the deposition process may become less efficient. Thus the thickness of the thin film formed on a wafer 200 may be reduced, e.g., after a predetermined time of deposition. On the other hand, as the thickness of the by-products BP is decreased, the detected intensity of the laser beam may be increased, and the deposition process may be more efficient. Thus the thickness of the thin film formed on the wafer 200 may be increased, e.g., after a predetermined time of deposition.

The analysis and control computer 180 may also determine whether a temperature detected by the pyrometer 160 is accurate, for example within an acceptable range, with reference to the detected intensity of the laser beam. As can be seen from FIG. 8, when the cover dome 110c is thickly coated with the by-products BP, an error may be caused in the temperature measurement of the pyrometer 160. Therefore, similarly to the above-described quantification of the thickness of the by-products BP, a temperature change may be quantified and/or compensated when a detected temperature by the pyrometer 160 deviates from a permissible range. For example, the measurement temperature of the pyrometer 160 may be converted into an actual temperature with reference to the intensity of the laser beam. For example, when the difference between the measurement temperature of the pyrometer 160 and the actual temperature is out of a permissible range, the analysis and control computer 180 may correct the temperature of the pyrometer 160 based on the detected intensity of the laser beam. For example, the analysis and control computer 180 may adjust the temperature in the chamber by adjusting the lamps 140 so that the temperature in the chamber becomes a proper temperature.

The analysis and control computer 180 may adjust the process condition in the deposition process according to the detected intensity of the laser beam or the state of the by-products. For example, the analysis and control computer 180 may determine a wet cleaning time point, a dry cleaning method, or a replacement time point of the cover dome 110c, or the like according to the detected intensity of the laser beam or the state of the by-products. For example, the wet cleaning time point may be a time point at which a wet cleaning is performed by separating the cover dome 110c from the chamber body 115. For example, the dry cleaning method may include a method of determining an end point of cleaning in dry cleaning. For example, when the thickness of the by-products is small, the end point of the cleaning may be set to about 10 seconds from a starting time point of the dry cleaning, and when the thickness of the by-products is large, the end point of the cleaning may be set to about 15 seconds from a starting time point of the dry cleaning.

The analysis and control computer 180 may be implemented as, for example, a general-purpose personal computer (PC), a workstation, a supercomputer, or the like.

The deposition process monitoring system 100 in the present embodiment may include the laser sensor 120h, and thus may detect the intensity of the laser beam transmitted through the cover dome 110c using the laser sensor 120h in the deposition process. For example, the state of the by-products BP with which the cover dome 110c is coated may be determined based on the detected intensity of the laser beam. For example, the thickness of the by-products BP may be calculated based on the detected intensity of the laser beam.

The deposition process monitoring system 100 in the present embodiment may check the state of the by-products in real time by detecting the intensity of the laser beam in the deposition process, and thus may perform adjustment of the process condition, correction of the temperature of the pyrometer 160, determination of the cleaning time point and cleaning method of the chamber 110, determination of the replacement time point of the cover dome 110c, and the like in the deposition process. For example, the deposition process monitoring system 100 in the present embodiment may control the deposition process, reduce times and costs in the deposition process, and reduce failure rate. For example, due to the improved deposition process, the reliability and production capability of the semiconductor device may be improved.

Figure 2:
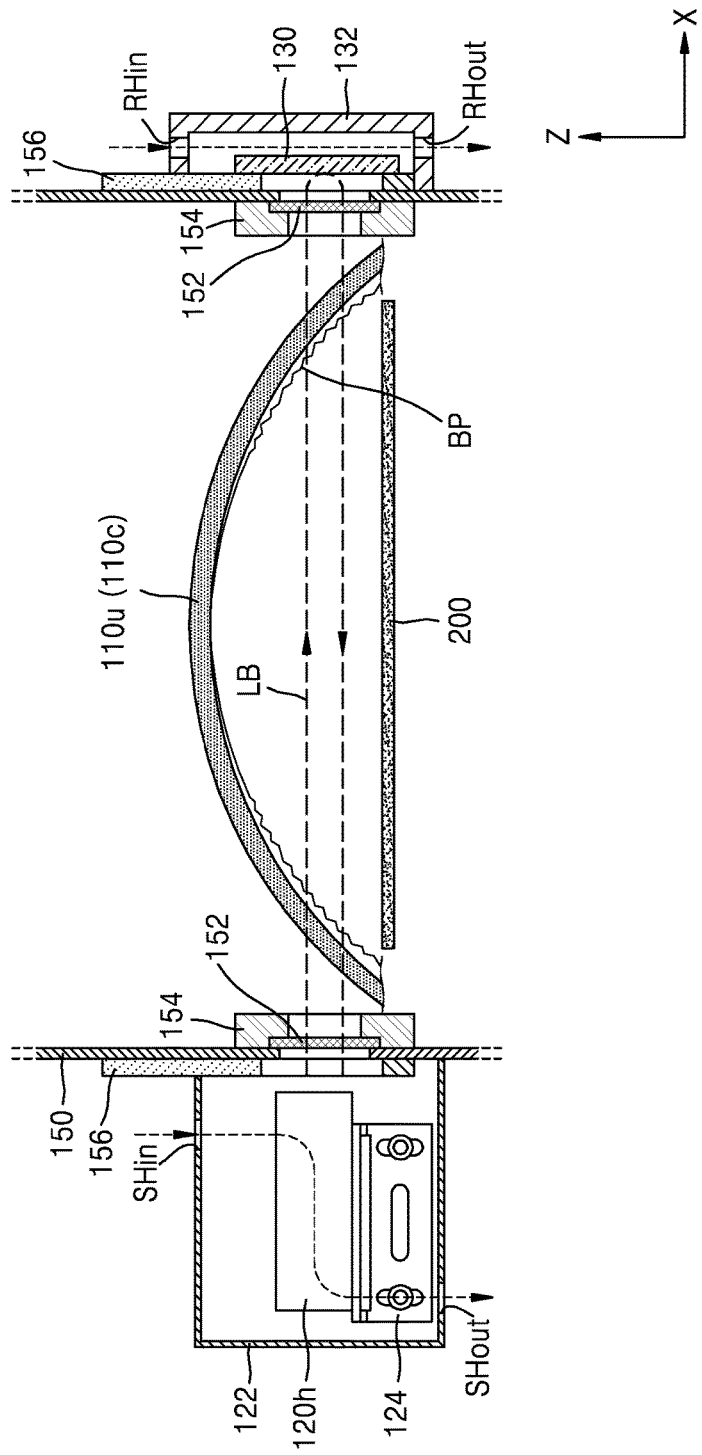
FIG. 2 is a cross-sectional view illustrating a laser sensor, a reflection plate, and a portion of a chamber corresponding thereto in the deposition process monitoring system of FIG. 1 in more detail.

FIG. 2 is a cross-sectional view illustrating the laser sensor 120h, the reflection plate 130, and a portion of the chamber 110 corresponding thereto in the deposition process monitoring system of FIG. 1 in more detail. For convenience of understanding, only a portion of the upper dome 110u and the wafer 200 are illustrated in the chamber 110, and only portions of the facility cover 150 on which the laser sensor 120h and the reflection plate 130 are disposed are illustrated. Contents which have already been described in connection with FIG. 1 will be briefly described or omitted.

Referring to FIG. 2, the laser sensor 120h may be disposed on a left side wall of the facility cover 150 and surrounded by a sensor cover 122. The laser sensor 120h may be disposed on a bracket 124 and supported by the bracket 124.

A laser beam LB may be transmitted through the cover dome 110c, e.g., the upper dome 110u, from the laser sensor 120h. The laser beam LB may proceed to the reflection plate 130, may be reflected by the reflection plate 130, may be transmitted through the cover dome 110c again, and may be incident on the laser sensor 120h.

An air injection hole SHin may be formed in an upper surface of the sensor cover 122 and an air exhausting hole SHout may be formed in a lower surface of the sensor cover 122. As indicated by an arrow, a cooling gas may be injected into the laser sensor 120h through the air injection hole SHin to cool the laser sensor 120h, and then may be exhausted through the air exhausting hole SHout. The bracket 124 may support the laser sensor 120h and function to adjust horizontal and vertical positions of the laser sensor 120h. The laser sensor 120h, the sensor cover 122, and the bracket 124 will be described in more detail in the description of FIGS. 3A to 3C.

The reflection plate 130 may be disposed on a right side wall of the facility cover 150 and surrounded by a reflection plate cover 132. An air injection hole RHin may be formed in an upper surface of the reflection plate cover 132, and an air exhausting hole RHout may be formed in a lower surface of the reflection plate cover 132. As indicated by an arrow, a cooling gas may be injected into the reflection plate 130 through the air injection hole RHin to cool the reflection plate 130, and then may be exhausted through the air exhausting hole RHout. The reflection plate 130 and the reflection plate cover 132 will be described in more detail in the description of FIGS. 4A and 4B.

IR filters 152 may be disposed at the view-port portions of the facility cover 150 on which the laser sensor 120h and the reflection plate 130 are disposed. The IR filters 152 may block IR from the inside of the chamber 110. For example, the IR filters 152 may transmit electromagnetic waves such as visible rays, UV, and the like, and may block electromagnetic waves having a long wavelength such as IR. The IR filters 152 may be coupled to an inner surface of the facility cover 150 by filter coupling units 154. However, the inventive concept is not limited thereto, and the IR filters 152 may be coupled to an outer surface of the facility cover 150.

As the IR filters 152 are disposed on the facility cover 150, the IR filters 152 may block infrared electromagnetic waves, e.g., heat rays, to be incident on the laser sensor 120h and the reflection plate 130 to protect the laser sensor 120h and the reflection plate 130. Therefore, detection performance of the laser beam may be improved. The IR filters 152 will be described in more detail in the description of FIGS. 6A and 6B.

Shutters 156 may be disposed on outer surfaces of the view-port portions of the facility cover 150 to be coupled thereto. The shutters 156 may be formed of a metal material to block electromagnetic waves coming from the inside of the chamber 110. However, the material of the shutter 156 is not limited to a metal. For example, the shutters 156 may be formed of ceramic or a plastic material having a characteristic that can effectively block electromagnetic waves. Further, the shutters 156 are not limited to the outer surface of the facility cover 150 and may be disposed on the inner surface of the facility cover 150 to be coupled thereto.

The shutters 156 may be disposed at the view-port portions of the facility cover 150 on which the laser sensor 120h and the reflection plate 130 are disposed, may block the view-port portions of the facility cover 150 when the laser sensor 120h does not perform the detection of the laser beam LB, and thus may protect the laser sensor 120h and the reflection plate 130 from electromagnetic waves. For example, the laser sensor 120h may maintain an ON state when the detection of the laser beam LB is performed and may be turned off when the detection operation of the laser bean LB is not performed. In certain embodiments, the laser sensor 120h may be turned on regardless of the performance of the detection operation of the laser beam LB.

Figure 3A:
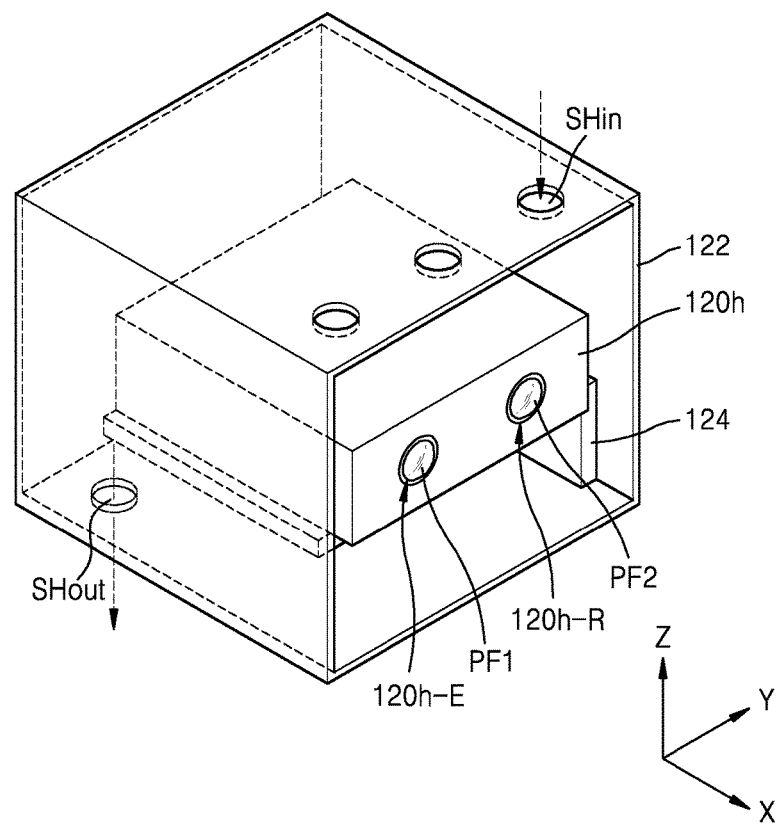
FIGS. 3A to 3C are a perspective view and cross-sectional views illustrating the laser sensor used in the deposition process monitoring system of FIG. 1.
Figure 3B:
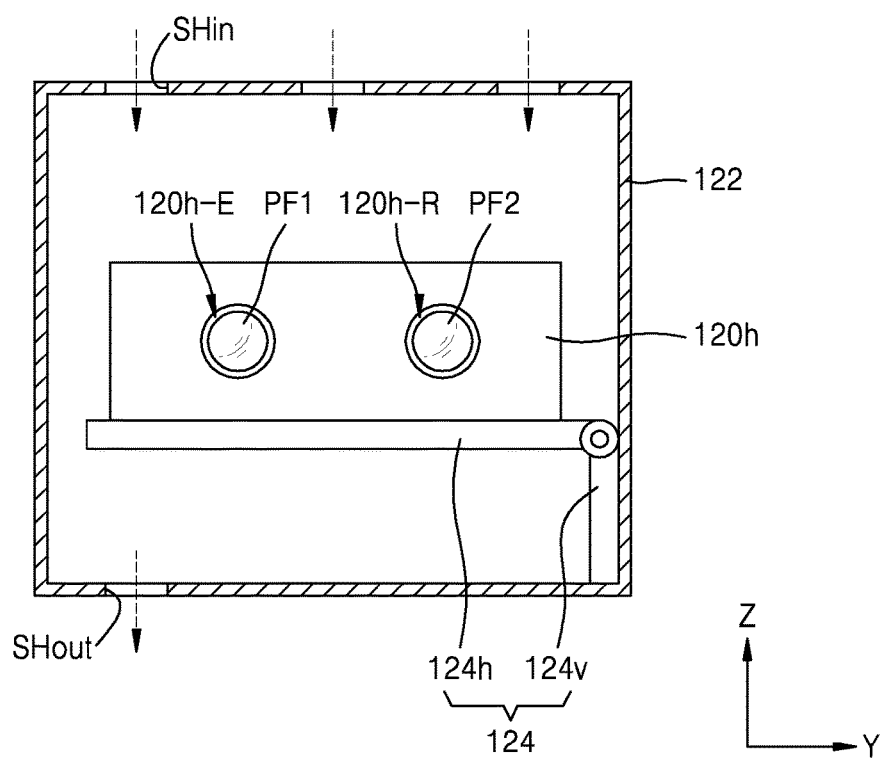
Figure 3C:
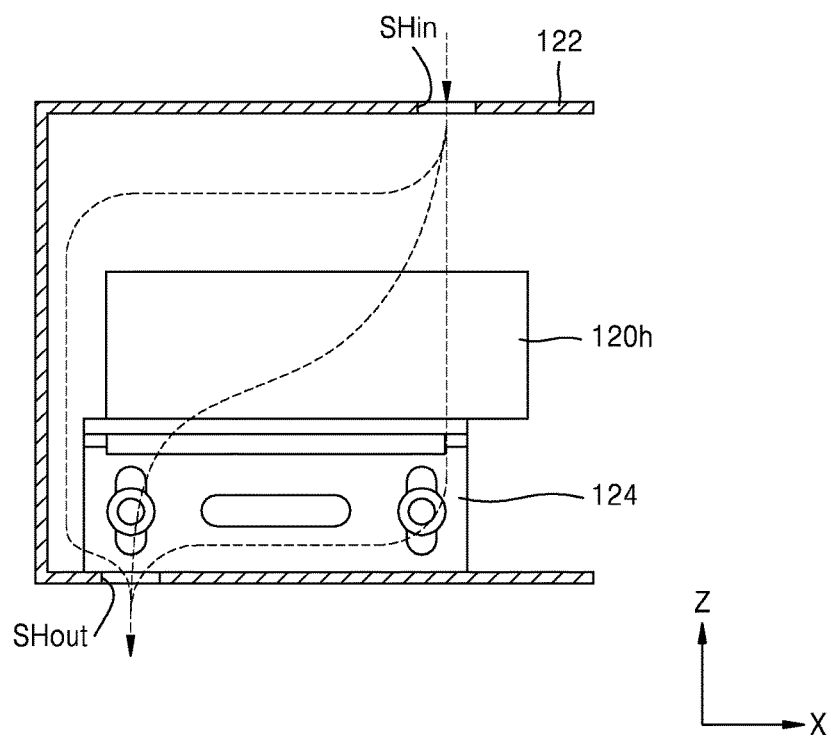

FIGS. 3A to 3C are a perspective view and cross-sectional views illustrating the laser sensor used in the deposition process monitoring system of FIG. 1.

Referring to FIGS. 3A to 3C, the laser sensor 120h may be supported by the bracket 124, and may be surrounded by the sensor cover 122 which is open in a first direction (an X direction). The laser sensor 120h may be coupled to the facility cover 150 so that the open portion of the sensor cover 122 faces the facility cover 150.

The laser sensor 120h may include a light emitting unit 120h-E and a light receiving unit 120h-R. The light emitting unit 120h-E may generate a laser beam and irradiate with the laser beam, and the light receiving unit 120h-R may receive light from the outside. The light emitting unit 120h-E may generate a laser beam in a wavelength range which is effective for the detection of the state of by-products BP to irradiate the cover dome 110c of the chamber 110 with the laser beam. For example, the laser beam may have a wavelength that can be distinguished from other light inside the chamber 110, for example, IR which transfers the radiant heat energy from the lamps 140 (see FIG. 1). For example, when the light of the lamp corresponds to the IR having a peak at about 1 μm, the laser beam may have a wavelength in a range of about 0.5 μm to 4 μm except for a wavelength within a wavelength range adjacent to 1 μm, for example, a wavelength range of about 1±0.1 μm. For example, the laser beam may have a specific pulse form that does not interfere with the light of the lamp. For example the laser beam may have a pulse laser beam so that the laser beam may be easily distinguishable from the light emitted from the lamps 140. For example the laser beam may have a form of repeating pulses of laser. Since the laser beam does not interfere with the light of the lamp, detection performance of the laser beam by the laser sensor 120h may be improved. For example, the detection performance of the laser beam by the laser sensor 120h may not be interfered by the heat wave of the lamps. The laser beam may be a multi-wavelength laser beam suitable for detection of a transparent body. The multi-wavelength laser beam may reduce an effect of light reflected by a surface of the transparent body when the multi-wavelength laser beam is transmitted through the transparent body, and thus may contribute to improve the detection performance of the laser beam.

The laser beam may not be limited to the specific wavelength range, the specific pulse form, or the multi-wavelength laser beam. In this case, the laser sensor 120h may operate while the lamps 140 are turned off. For example, when the lamps are in an ON state, the laser sensor 120h itself may be turned off or the view-port portions of the facility cover 150 are blocked by the shutters 156 (see FIG. 2), and thus the laser sensor 120h may not operate. The laser sensor 120h may operate when the lamps are in an OFF state, and the detection of the laser beam may be performed.

The light receiving unit 120h-R may receive light from the inside of the chamber 110, e.g., a laser beam emitted from the light emitting unit 120h-E and reflected by the reflection plate 130. The light receiving unit 120h-R may include a plurality of photodiodes which convert light energy into electric energy. The light receiving unit 120h-R may be implemented as, for example, a charge-coupled device (CCD) sensor or a complementary metal-oxide-semiconductor (CMOS) sensor.

The IR filters 152 (see FIG. 2) may be disposed at the view-port portions of the facility cover 150 so that the light receiving unit 120h-R mainly receives a laser beam with which the light emitting unit 120h-E irradiates. The IR filters may block the IR waves coming from the lamps 140 (see FIG. 1) to the light receiving unit 120h-R. The reflection plate 130 may have a retro-reflection characteristic, and the laser beam coming from the light emitting unit 120h-E may be reflected by the reflection plate 130 and may be redirected toward the light receiving unit 120h-R. Accordingly, the light receiving unit 120h-R may receive most of the laser beam emitted from the light emitting unit 120h-E except for an amount of the laser beam absorbed and/or reflected by by-product BP and/or the cover dome 110c.

Polarizing filters PF1 and PF2 having different polarization characteristics may be disposed on front ends of the light emitting unit 120h-E and the light receiving unit 120h-R, respectively. As illustrated in FIGS. 3A and 3B, a first polarizing filter PF1 may be disposed on the front end of the light emitting unit 120h-E, and a second polarizing filter PF2 may be disposed on the front end of the light receiving unit 120h-R. For example, when the first polarizing filter PF1 has a vertical polarization characteristic, the second polarizing filter PF2 may have a horizontal polarization characteristic. The reflection plate 130 (see FIG. 2) may rotate a polarization of incident light by about 90° in a retro-reflective form.

For example, a process of proceeding a laser beam using the polarizing filters PF1 and PF2 and the reflection plate 130 is as follows. First, a laser beam coming from the light emitting unit 120h-E is vertically or horizontally polarized while being transmitted through the first polarizing filter PF1, is transmitted through the cover dome 110c, and then, is incident on the reflection plate 130. The laser beam incident on the reflection plate 130 is changed to horizontal or vertical polarization by being rotated by about 90°, is transmitted through the cover dome 110c again, and is received by the light receiving unit 120h-R through the second polarizing filter PF2 having a horizontal or vertical polarization characteristic. For example, the light receiving unit 120h-R may exclude or reduce external light such as the IR of the lamp and receives mostly the laser beam from the light emitting unit 120h-E due to the polarization effect of the polarizing filters PF1 and PF2 and the reflection plate 130, and thus detection performance of the laser beam may be improved.

As the sensor cover 122 surrounds the laser sensor 120*h* and the bracket 124, the sensor cover 122 may protect the laser sensor 120*h* and the bracket 124 from external physical and chemical damage. A cooling gas may flow inside the sensor cover 122, and thus the laser sensor 120*h* may be protected from thermal damage. To flow the cooling gas, the air injection hole SHin may be formed in the upper surface of the sensor cover 122, and the air exhausting hole SHout may be formed in the lower surface of the sensor cover 122. The cooling gas may be introduced to the laser sensor 120*h* through the air injection hole SHin to cool the laser sensor 120*h* while proceeding through various paths, and then may be exhausted to the outside through the air exhausting hole SHout. Although not illustrated, pipes through which a cooling gas may flow may be coupled to the air injection hole SHin and the air exhausting hole SHout.

The bracket 124 may have an inverted L-shaped structure in a cross sectional view as illustrated in FIG. 3B, and may support the laser sensor 120*h* disposed thereon. Although not illustrated in detail, a horizontal plate 124*h* of the bracket 124 may rotate and/or move in a third direction (a Z direction), and a vertical plate 124*v* of the bracket 124 may move in the first and second directions (X and Y directions). Accordingly, the horizontality of the laser sensor 120*h* may be adjusted by adjusting the horizontal plate 124*h*. A proceeding angle and/or position of the laser beam on an X-Y plane may be adjusted by adjusting the vertical plate 124*v*. For example, positions including heights of the laser sensor 120*h* and/or emitting angles of laser may be adjusted by the bracket 124. A structure of the bracket 124 is not limited to the illustrated structure, and the bracket 124 may have various structures.

Figure 4A:
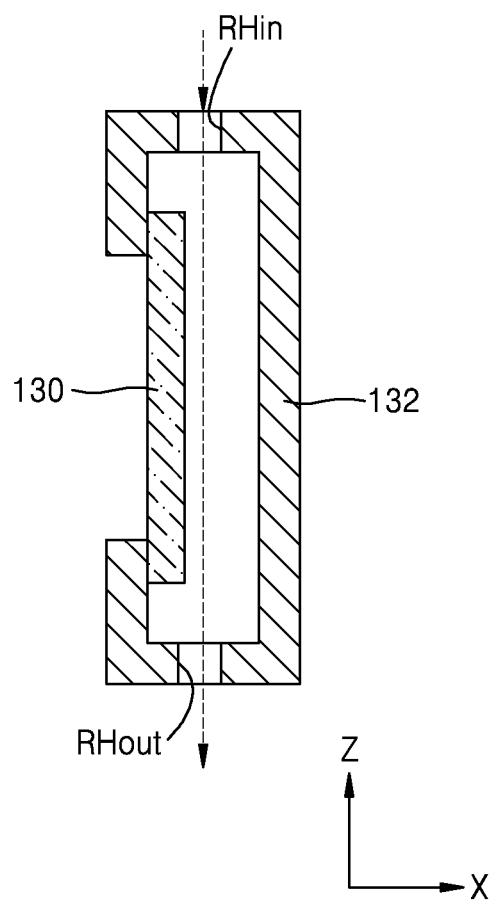
FIGS. 4A and 4B are cross-sectional views illustrating the reflection plate used in the deposition process monitoring system of FIG. 1.
Figure 4B:
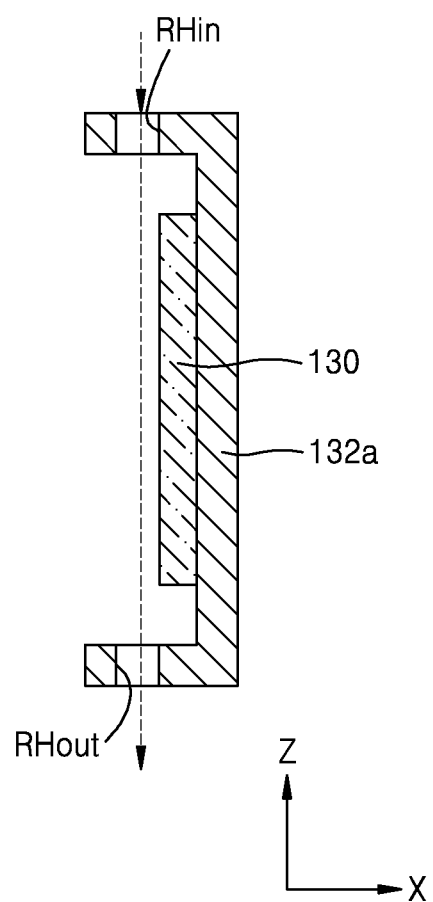

FIGS. 4A and 4B are cross-sectional views illustrating the reflection plate used in the deposition process monitoring system of FIG. 1.

Referring to FIG. 4A, the reflection plate 130 may be surrounded by the reflection plate cover 132 and coupled to the view-port portion of the facility cover 150 (see FIG. 1). The reflection plate cover 132 may have a structure in which a portion is open in a negative direction of the first direction (a −X direction) from a center of the reflection plate cover 132, and the reflection plate 130 may be coupled to the open portion of the reflection plate cover 132. The reflection plate cover 132 may surround the reflection plate 130, and thus may protect the reflection plate 130 from external physical and chemical damage.

A cooling gas may flow inside the reflection plate cover 132, and thus the reflection plate 130 may be protected from thermal damage. To flow the cooling gas, the air holes RHin and RHout may be formed in the upper surface and the lower surface of the reflection plate cover 132 respectively. A cooling gas may be introduced to the reflection plate 130 through the air injection hole RHin to cool the reflection plate 130 while proceeding downward, and then may be exhausted to the outside through the air exhausting hole RHout. Although not illustrated, pipes through which the cooling gas may flow may be coupled to the air injection hole RHin and the air exhausting hole RHout.

Referring to FIG. 4B, a reflection plate cover 132*a* may have a structure in which a front surface is open in a negative direction (from a center of the reflection plate cover 132*a*) of the first direction (the −X direction) unlike the reflection plate cover 132 in FIG. 4A. For example, the reflection plate 130 may be coupled to an inner side surface of a closed portion of the reflection plate cover 132*a*. The air holes RHin and RHout may be formed in the upper surface and lower surface of the reflection plate cover 132*a*. A cooling gas may flow inside the reflection plate cover 132*a*, and thus may protect the reflection plate 130 from thermal damage.

Figure 5A:
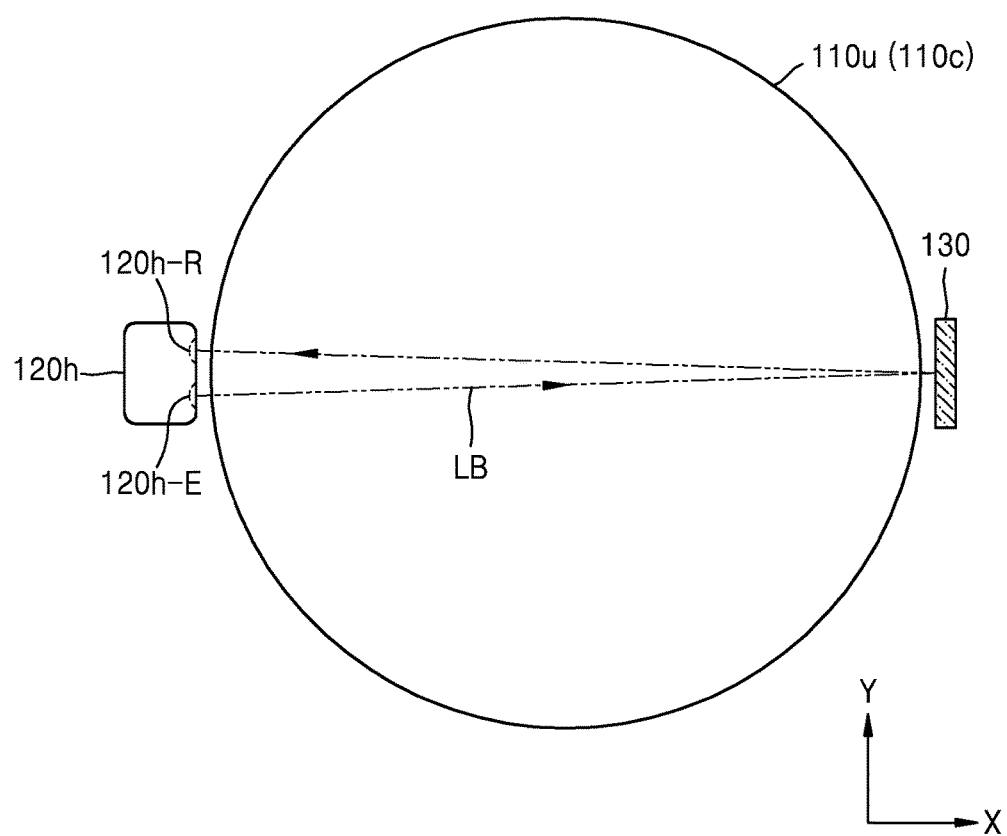
FIGS. 5A and 5B are plan views illustrating a relationship between positions of the laser sensor and the reflection plate used in the deposition process monitoring system of FIG. 1.
Figure 5B:
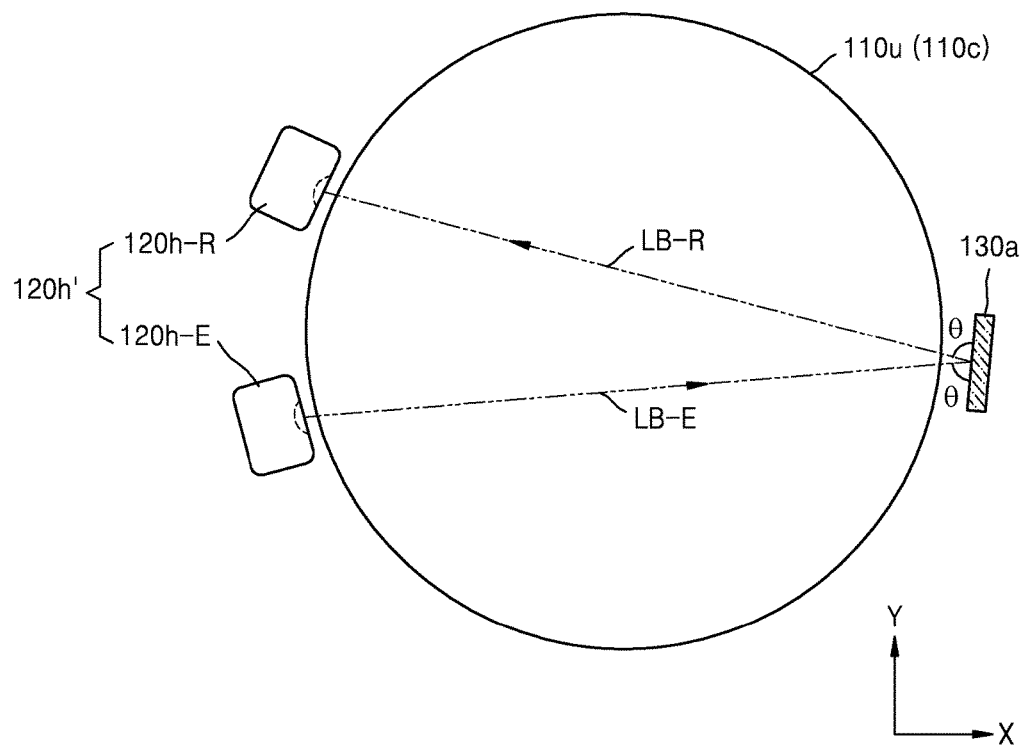

FIGS. 5A and 5B are plan views illustrating a relationship between positions of the laser sensor and the reflection plate used in the deposition process monitoring system of FIG. 1.

Referring to FIG. 5A, the laser sensor 120*h* may have a structure including the light emitting unit 120*h*-E and the light receiving unit 120*h*-R as illustrated in FIG. 3A. In the laser sensor 120*h* having such a structure, a laser beam LB may be transmitted through the cover dome 110*c* in a first direction (an X direction) from the light emitting unit 120*h*-E, may be incident on the reflection plate 130, may be reflected by the reflection plate 130, may be transmitted through the cover dome 110*c* again in a negative direction of the first direction (an −X direction), and may be incident on the light receiving unit 120*h*-R. Here, the reflection plate 130 may have a retro-reflection characteristic, and reflect the incident laser beam LB to the light receiving unit 120*h*-R portion of the laser sensor 120*h*.

Referring to FIG. 5B, a laser sensor 120W may have a structure in which a light emitting unit 120*h*-E and a light receiving unit 120*h*-R are separated from each other unlike the structure of the laser sensor 120*h* of FIG. 3A. In the laser sensor 120W having such a structure, a direction of a laser beam LB-E emitted from the light emitting unit 120*h*-E may be different from a direction of a laser beam LB-R incident on the light receiving unit 120*h*-R.

For example, the light emitting unit 120*h*-E and the light receiving unit 120*h*-R may be disposed at different positions of the cover dome 110*c* and/or the facility cover 150. Further, the reflection plate 130*a* may follow a general reflection rule. For example, when the laser beam LB-E is incident on an upper surface of the reflection plate 130*a* at a first angle θ, the reflected laser beam LB-R may also have the first angle θ with respect to the upper surface of the reflection plate 130*a*. Generally, although the reflection rule is defined by an angle of incidence and an angle of reflection with respect to a normal of a reflective surface, the same result may be obtained even when the reflection rule is described using an angle with respect to the reflective surface.

The laser sensor 120W in the present embodiment has an advantage in that the reflection plate 130*a* having a general reflective characteristic may be used. On the other hand, it is beneficial to accurately adjust positions of the light emitting unit 120*h*-E and the light receiving unit 120*h*-R so as to match an incidence angle of the reflection plate 130*a* and an angle of reflection thereof. At least three view-ports corresponding to the light emitting unit 120*h*-E, the light receiving unit 120*h*-R, and the reflection plate 130*a* may be formed in the facility cover 150.

Figure 6A:
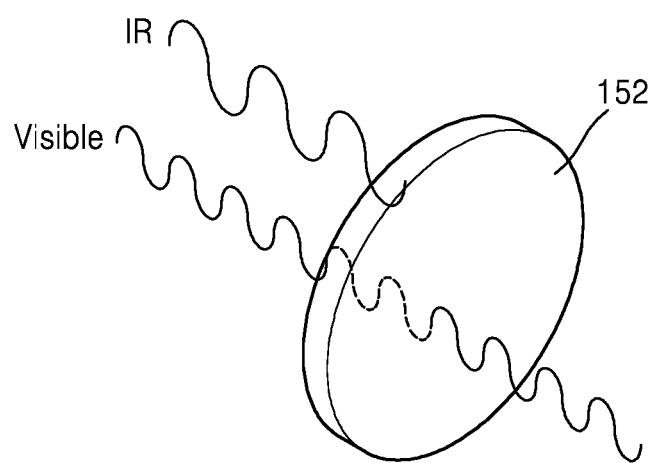
FIGS. 6A and 6B are a perspective view and an electromagnetic wave transmission characteristic graph illustrating an infrared (IR) filter used in the deposition process monitoring system of FIG. 1.
Figure 6B:
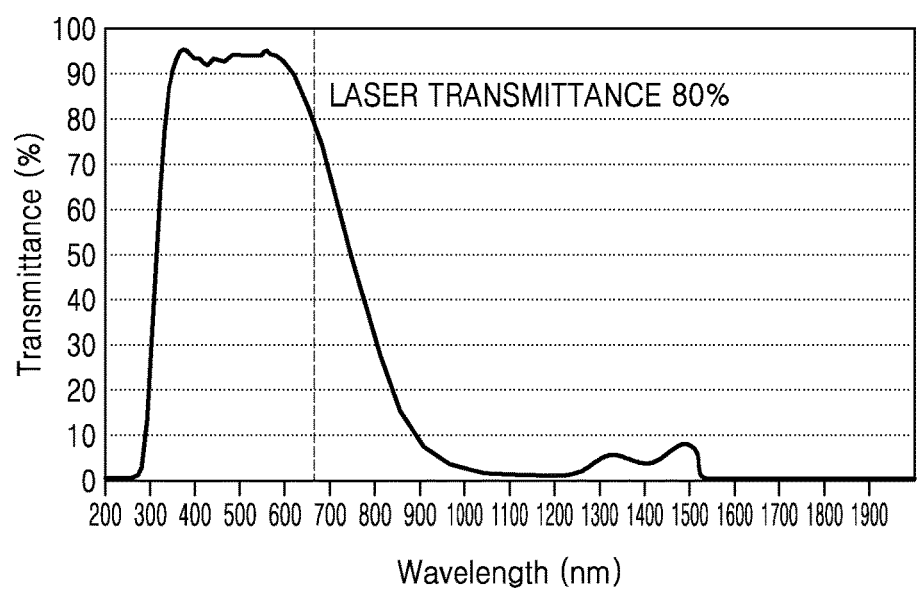

FIGS. 6A and 6B are a perspective view and an electromagnetic wave transmission characteristic graph illustrating the IR filter used in the deposition process monitoring system of FIG. 1.

Referring to FIGS. 6A and 6B, the IR filter 152 may have a circular plate shape. However, the shape of the IR filter 152 is not limited to the circular plate shape, and the IR filter 152 may have a polygonal plate shape such as a rectangular shape, a pentagonal shape, and the like. In FIG. 6A, although a thickness of the IR filter 152 is slightly exaggerated, the IR filter 152 may have a small thickness of about several μm. The IR filter 152 may have a function in which IR is essentially blocked, and electromagnetic waves having a smaller wavelength than the IR such as a visible ray are transmitted.

As can be seen from the graph of FIG. 6B, the IR filter 152 may exhibit a transmittance of almost about 80% at a wavelength of 700 nm or less, exhibit a transmittance of 30% or less at a wavelength of 800 nm or more, and exhibit a transmittance of almost about 0% at a wavelength of about 1,000 nm, that is, about Therefore, when a light of the lamp 140 (see FIG. 1) is IR having a peak of 1 μm, the IR filter 152 may effectively block the light of the lamp.

As illustrated in the graph, the IR filter 152 may block light of a wavelength of 300 nm or less, for example, UV. Therefore, when the lamp includes a UV lamp, the IR filter 152 may also block UV from the UV lamp.

Figure 7A:
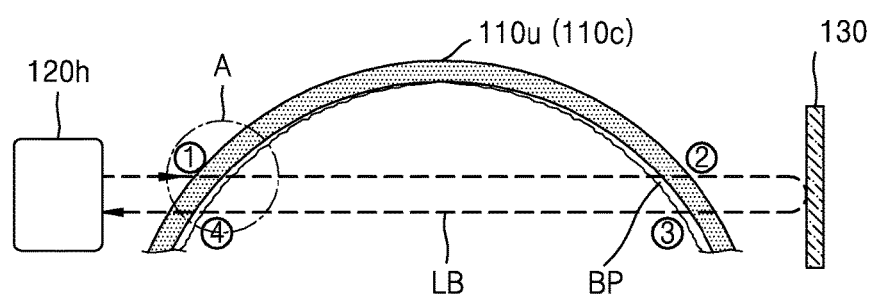
FIGS. 7A and 7B are cross-sectional views illustrating a process in which a laser beam of a horizontal type laser sensor used in the deposition process monitoring system of FIG. 1 is transmitted through a quartz dome.
Figure 7B:
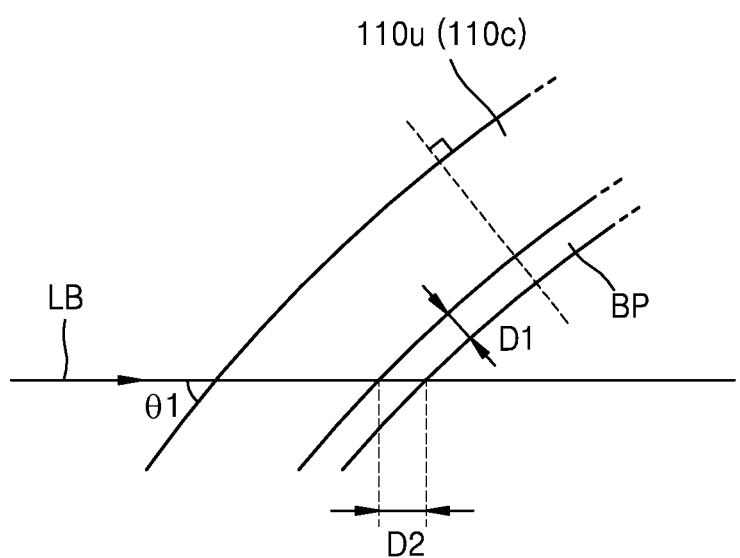

FIGS. 7A and 7B are cross-sectional views illustrating a process in which a laser beam of the horizontal type laser sensor used in the deposition process monitoring system of FIG. 1 is transmitted through a quartz dome, where FIG. 7B is an enlarged cross-sectional view of an A portion of FIG. 7A. For convenience of description, only the laser sensor 120h, the reflection plate 130, and a portion of the upper dome 110u are schematically illustrated.

Referring to FIGS. 7A and 7B, a laser beam LB may be transmitted through the upper dome 110u four times from when being emitted from the light emitting unit 120h-E (see FIG. 3A) of the laser sensor 120h to when being received by the light receiving unit 120h-R (see FIG. 3A). For example, the laser beam LB is emitted from the light emitting unit, firstly, is transmitted through a left side portion of the upper dome 110u, is introduced into the chamber 110, and passes the inside of the chamber 110 (①), secondly, is transmitted through a right side portion of the upper dome 110u, is incident on the reflection plate 130 outside the chamber 110, is reflected by the reflection plate 130 (②), thirdly, is transmitted through the right side portion of the upper dome 110u again, is introduced into the chamber 110, and passes the inside of the chamber 110 (③), and fourthly, is transmitted through the left side portion of the upper dome 110u again, and is incident on the light receiving unit (④). Therefore, the laser beam LB may be transmitted through the upper dome 110u a total of four times.

In this manner, as the laser beam LB is transmitted through the upper dome 110u four times, the intensity of the laser beam LB may be significantly reduced by by-products BP. Therefore, the state of the by-products BP by the detection of the intensity of the laser beam LB may be more accurately analyzed.

As illustrated in FIG. 7B, the laser beam LB may be obliquely incident on the upper dome 110c. Because the laser beam LB is obliquely incident on the upper dome 110c, the influence of laser beam reflected back on a surface of the upper dome 110c may be reduced. For example, an influence of reflected light from the surface of the upper dome 110c to the light receiving unit 120h-R may be reduced. Therefore, this may be effective for the detection of the by-products BP of a transparent material. Further, the laser beam LB is obliquely incident on the upper dome 110c, and thus a path of the by-products BP through which the laser beam LB is transmitted and passes may be elongated. Therefore, the intensity of the laser beam LB is further reduced due to the oblique incidence of the laser beam into the by-products BP, and thus it may be advantageous in that the state of the by-products BP is more accurately analyzed. For example, when the laser beam LB is perpendicularly incident on the surface of the upper dome 110c, the thickness of the by-products BP through which the laser beam LB is transmitted may have a first thickness D1. Further, when the laser beam LB is incident on the surface of the upper dome 110c with a first acute angle θ1, the thickness of the by-products BP through which the laser beam LB is transmitted may have a second thickness D2. The second thickness D2 may be greater than the first thickness D1.

Figure 8:
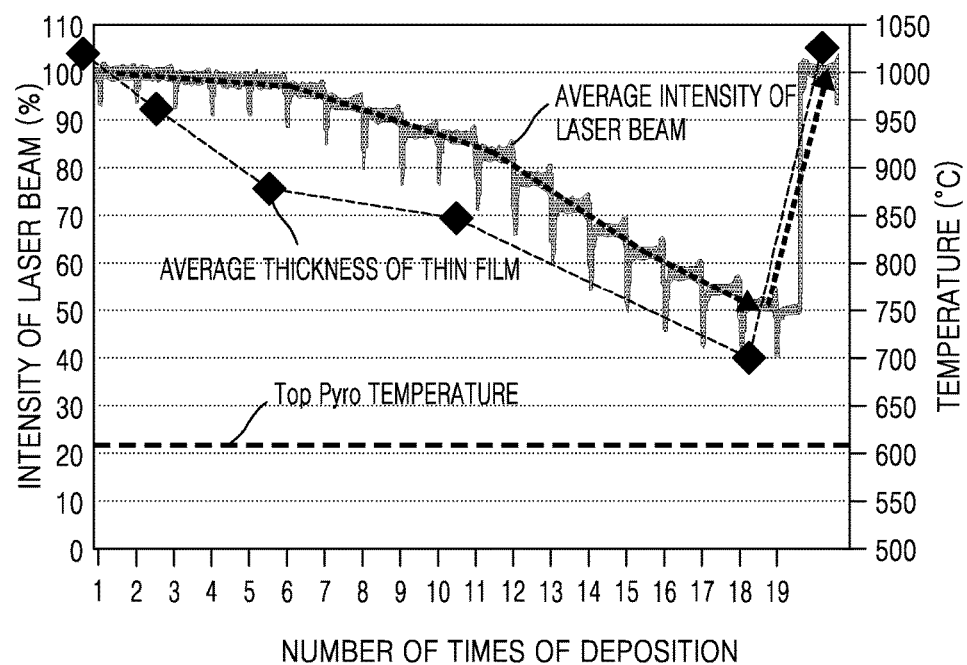
FIG. 8 is a measurement graph illustrating an intensity of a laser beam using the deposition process monitoring system of FIG. 1.

FIG. 8 is an example of a measurement graph illustrating an intensity of a laser beam using the deposition process monitoring system of FIG. 1, wherein an X-axis represents the number of times of deposition, a left side Y-axis represents intensities of a laser beam, and a right side Y-axis represents temperatures for the top pyrometer. A dashed arrow in an upper portion of the graph represents an average intensity of a laser beam of respective number of times of deposition, a dashed line in a lower portion of the graph represents a temperature measured by the pyrometer, and black squares represent an average thickness of a thin film deposited on the wafer by relative positions. In this example, a typical deposition process is performed nineteen times, and then the cover dome 110c is cleaned to remove by-product formed on the cover dome 110c.

Referring to FIG. 8, as the number of times of deposition is increased, it is seen that the intensity of the laser beam is reduced and the average thickness of the thin film is also reduced. Eventually, as the number of times of deposition is increased, it may be indirectly checked that the thickness of the by-products BP (see FIG. 1) is increased through the above-described result. For example, when the thickness of the by-products is increased, the intensity of the laser beam is reduced. It is assumed that an amount of the radiant heat energy supplied from the lamp 140 (see FIG. 1) into the chamber 110 (see FIG. 1) may be reduced, and the deposition process may not be smoothly performed, and therefore the thickness of the thin film formed on the wafer 200 (see FIG. 1) may be reduced.

Regarding the fluctuation of the laser intensity within each deposition step of FIG. 8, the laser intensity may be influenced by a cleaning process that follows each deposition process. In this example, when the deposition process is performed, it is followed by a dry cleaning process using a cleaning gas such as HCl, $Cl_2$, and the like. Therefore, as illustrated in FIG. 8, a portion in which the intensity of the laser beam is reduced may be measured after a deposition step, and a portion in which the intensity of the laser beam is increased may be measured after a dry cleaning step. For example, the fluctuation of laser intensity in FIG. 8 may represent a cycle of deposition process (including dry etching). The dashed arrow represents the average intensity of the laser beam in each deposition cycle. For example, the dashed arrow may show a trend of laser intensity changes when the deposition processes are accumulated.

In the example of FIG. 8, after the nineteenth deposition, the intensity of the laser beam received by a laser sensor dropped to about a half of the initial intensity of the laser beam received by the laser sensor. Cover dome 110c is cleaned after the nineteenth deposition to remove by-products formed on the cover dome 110c. The cover dome 110c is separated from the chamber body 115 and a wet cleaning is performed on the cover dome 110c after a nineteenth deposition process. The wet cleaning may use, for example, hydrogen fluoride (HF). In some cases, the cover dome 110c may be replaced with a new cover dome. The graph of FIG. 8 also shows that the thickness of the thin film formed on the wafer 200 is increased to an original state after the removing of the by-product from the cover dome 110c. This result may show that the removal of the by-product enhances transmission of the heat energy into the chamber 110 through the cover dome 110c.

For example, when the wet cleaning of the cover dome 110c is performed, the apparatus may be shutdown. In certain embodiments, an additional process removing water vapor and impurities from the chamber 110 may be performed after the cleaning is completed. The water vapor and the impurities may be generated during the cleaning process. The removing process of water vapor and impurities may be performed by pumping out the water vapor and impurities from the chamber 110. In certain embodiments, a process of setting a stable pressure and temperature may be performed after the cleaning of the cover dome 110c. For these reasons, frequent wet cleaning of the cover dome 110c may result in the reduction of productivity. Therefore, it may be beneficial to detect a proper time when the wet cleaning removing by-product from the cover dome 110c is performed.

The dashed line in the lower portion of the graph maintains an almost constant value (throughout the accumulated times of deposition process), and this may show that the state of the by-products may not be detected by the pyrometers 160, or whether the deposition process is properly performed may not be detected through the pyrometers 160 (see FIG. 1) in that the thin film thickness formed on the wafer 200 varies according to the accumulated times of deposition process. For example, the temperature in the chamber may be reduced by the increase of the thickness of the by-products. For example, the supply of the radiant heat energy may be reduced by the increase of the thickness of the by-products. The pyrometer may be unable to accurately measure the temperature in the chamber. As described above, the deposition process monitoring system 100 in the present embodiment may correct the temperature of the pyrometer based on the detected intensity of the laser beam through the analysis and control computer 180, and may adjust the temperature so as to become a required process temperature by controlling the lamp through the analysis and control computer 180.

Figure 9:
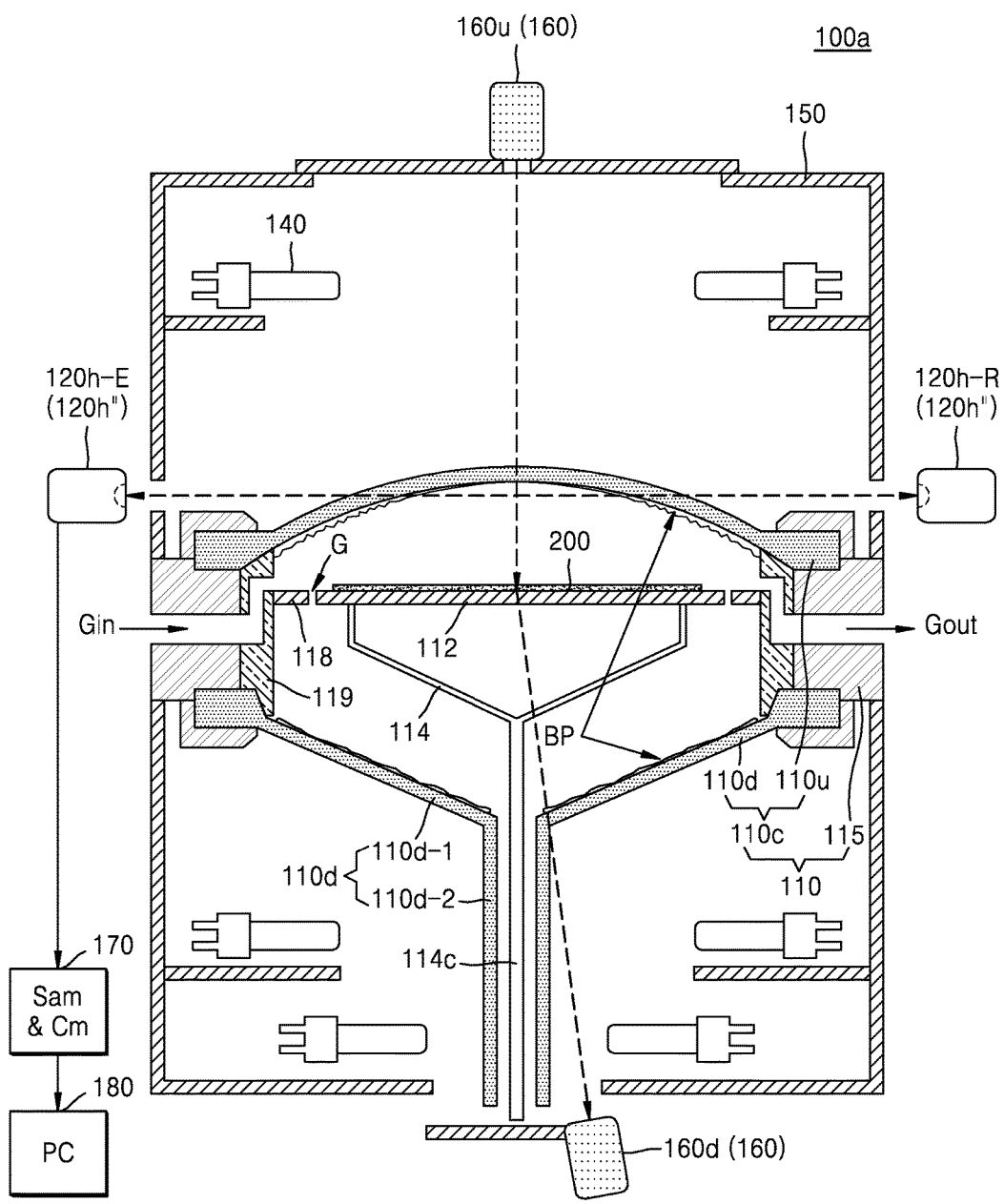
FIG. 9 is a cross-sectional view schematically illustrating a deposition process monitoring system according to one embodiment of the inventive concept.

FIG. 9 is a cross-sectional view schematically illustrating a deposition process monitoring system according to one embodiment of the inventive concept. Contents which have already been described in FIGS. 1 to 4B will be briefly described or omitted.

Referring to FIG. 9, a deposition process monitoring system 100a in the present embodiment may include a laser sensor 120h' unlike the deposition process monitoring system 100 of FIG. 1. For example, in the deposition process monitoring system 100a in the present embodiment, the laser sensor 120h" may have a structure in which a light emitting unit 120h-E and a receiving unit 120h-R are separated from each other like the laser sensor 120h' illustrated in FIG. 5B. For example, as illustrated in FIG. 9, the light emitting unit 120h-E may be disposed at a left side surface of the facility cover 150, and the light receiving unit 120h-R may be disposed at a right side surface of the facility cover 150 facing the light emitting unit 120h-E. For example, the deposition process monitoring system 100a in the present embodiment may not include a separate reflection plate unlike in FIG. 5B.

In the deposition process monitoring system 100a of the present embodiment, the light receiving unit 120h-R may directly receive a laser beam from the light emitting unit 120h-E without using the reflection plate. Therefore, the laser beam from the light emitting unit 120h-E may be transmitted through the cover dome 110c twice, and may be incident on the light receiving unit 120h-R.

Figure 10:
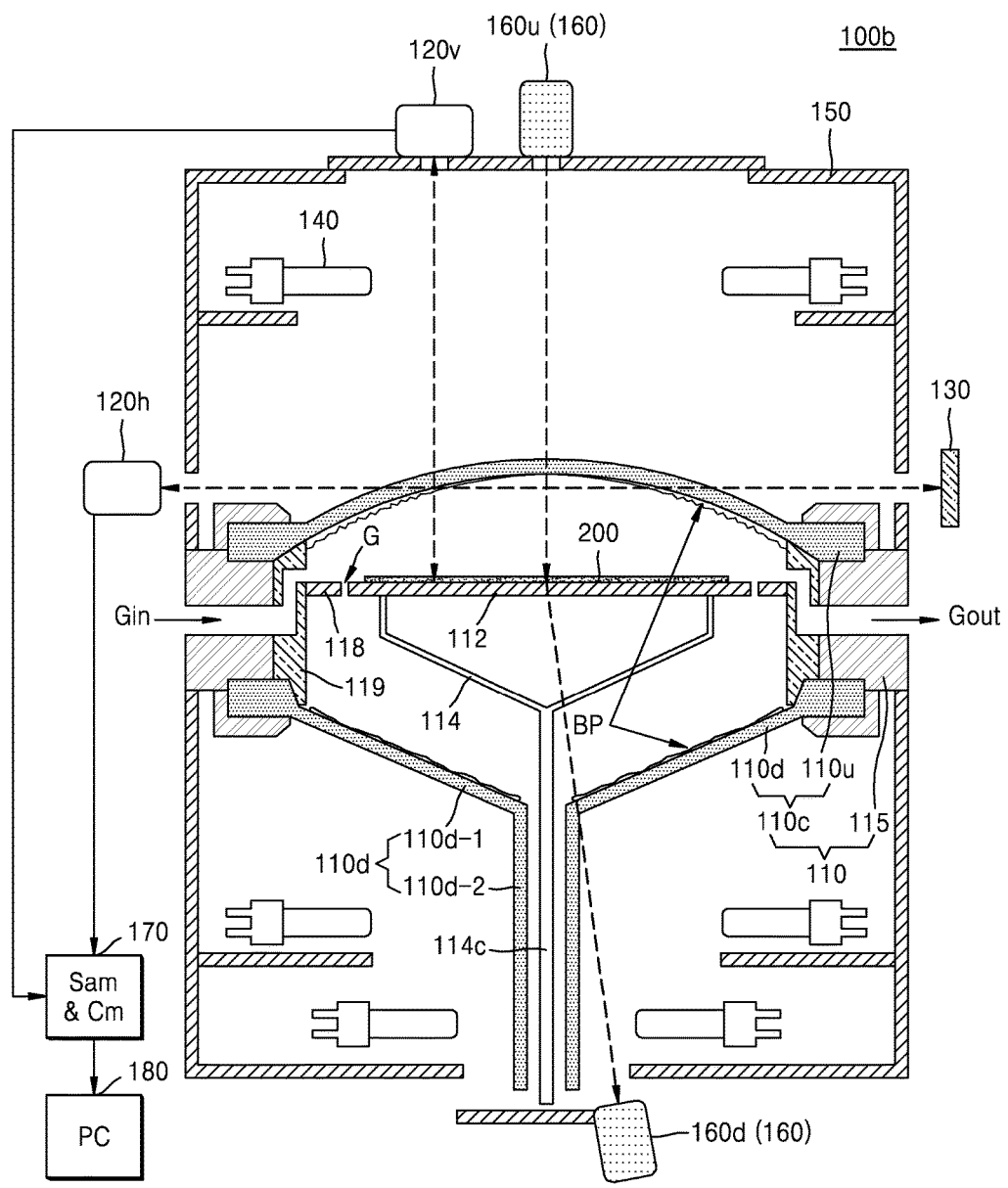
FIGS. 10 and 11 are a cross-sectional view and a plan view schematically illustrating a deposition process monitoring system according to one embodiment of the inventive concept.
Figure 11:
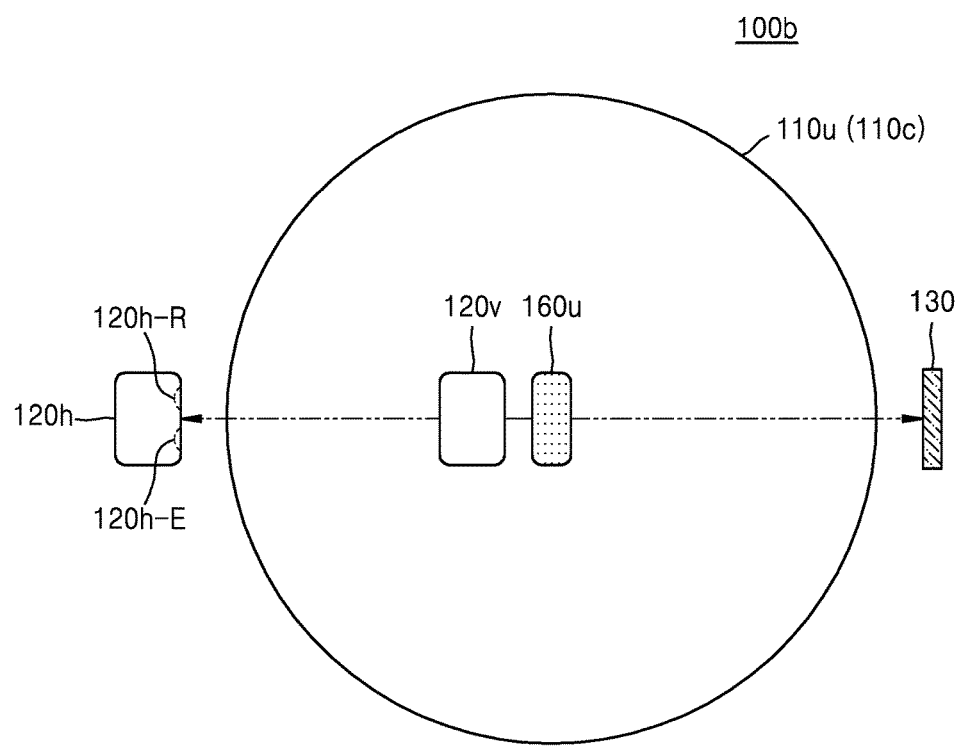

FIGS. 10 and 11 are a cross-sectional view and a plan view schematically illustrating a deposition process monitoring system according to one embodiment of the inventive concept. Contents which have already been described in FIGS. 1 to 4B will be briefly described or omitted.

Referring to FIGS. 10 and 11, a deposition process monitoring system 100b in the present embodiment may further include a laser sensor 120v unlike the deposition process monitoring system 100 of FIG. 1. For example, the deposition process monitoring system 100b in the present embodiment may further include the vertical type laser sensor 120v disposed on the upper surface of the facility cover 150. Hereinafter, for convenience of description, a laser sensor disposed on the side surface of the facility cover 150 is referred to as a horizontal type laser sensor 120h, and a laser sensor disposed on the upper surface of the facility cover 150 is referred to as a vertical type laser sensor 120v.

Since the horizontal type laser sensor 120h is substantially the same as the laser sensor 120h described in FIGS. 1 to 3C, detailed description thereof will be omitted.

The vertical type laser sensor 120v on the upper surface of the facility cover 150 may irradiate the wafer 200 which is a deposition target with a laser beam and receive the laser beam reflected by the wafer 200. Accordingly, the vertical type laser sensor 120v may basically include a light emitting unit (not illustrated) which generates and emits a laser beam and a light receiving unit (not illustrated) which receives the reflected laser beam. A characteristic of the laser beam used in the vertical type laser sensor 120v may be different from a characteristic of the laser beam used in the horizontal type laser sensor 120h. This is because the laser beam used in the vertical type laser sensor 120v is not reflected by a separate reflection plate and is directly reflected by the wafer 200. Therefore, in the vertical type laser sensor 120v, the laser beam may have a low absorption characteristic on the wafer 200 or on a thin film formed on the wafer 200. For example, the laser beam of the vertical type laser sensor 120v may be well reflected by the wafer 200 or a thin film deposited on the wafer 200.

An IR filter and/or a shutter may be disposed at a portion of the facility cover 150 on which the vertical type laser sensor 120v is disposed. Further, polarizing filters may be disposed at front ends of the light emitting unit and the light receiving unit. The polarizing filters of the light emitting unit and the light receiving unit may have the same polarization characteristic. For example, polarizers disposed at the light emitting unit and the light receiving unit may have the same polarizing direction as each other.

As illustrated in FIG. 11, the vertical type laser sensor 120v may be disposed adjacent to the upper pyrometer 160u. Accordingly, a state of the cover dome 110c through which a temperature in the chamber 110 is recognized by the upper pyrometer 160u may be more accurately checked by the vertical type laser sensor 120v. For example, by-products BP may be coated on the cover dome 110c depending on position of the cover dome 110c. For example, a central portion of the cover dome 110c away from the wafer 200 may be coated with by-products BP having a smaller thickness than the thickness of by-products BP in an edge portion of the cover dome 110c close to the wafer 200. Therefore, a portion relatively slightly coated with the by-products BP may affect the upper pyrometer 160u, and the vertical type laser sensor 120v may contribute to correct the temperature of the upper pyrometer 160u by relatively accurately checking the state of the by-products BP of the portion.

Figure 12A:
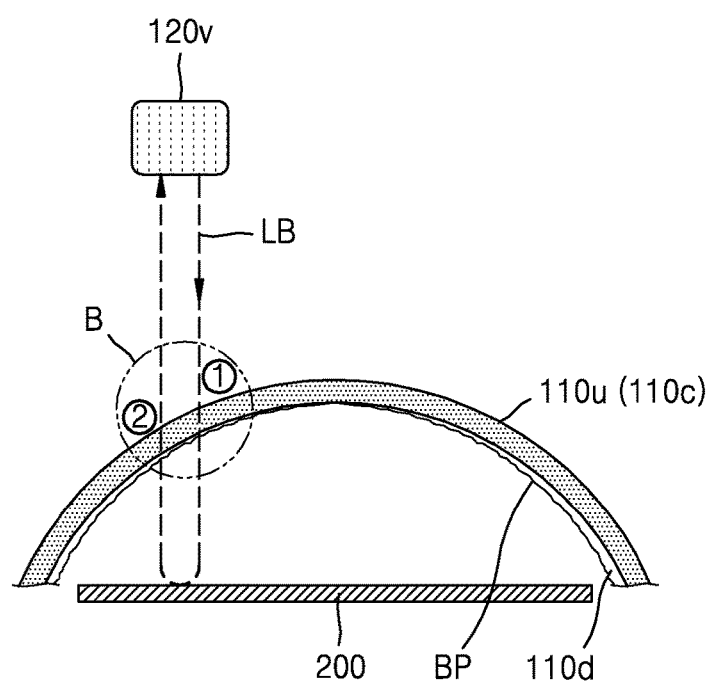
FIGS. 12A and 12B are cross-sectional views illustrating a process in which a laser beam of a vertical type laser sensor used in the deposition process monitoring system of FIG. 10 is transmitted through a quartz dome.
Figure 12B:
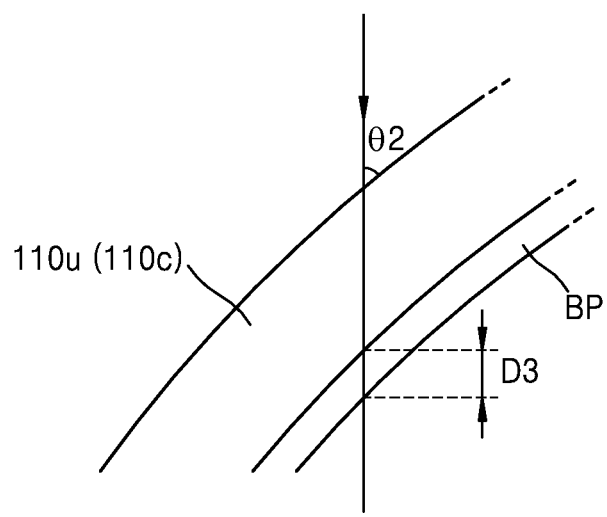

FIGS. 12A and 12B are cross-sectional views illustrating a process in which the laser beam of the vertical type laser sensor used in the deposition process monitoring system of FIG. 10 is transmitted through a quartz dome, where FIG. 12B is an enlarged cross-sectional view of a B portion of FIG. 12A. For convenience of description, only the vertical type laser sensor 120v, the wafer 200, and a portion of the upper dome 110u are schematically illustrated.

Referring to FIGS. 12A and 12B, a laser beam LB may be transmitted through the upper dome 110u twice from when being emitted from the light emitting unit of the vertical type laser sensor 120v to when being received by the light receiving unit. For example, the laser beam LB is emitted from the light emitting unit, firstly, is transmitted through the upper dome 110u, is incident on the wafer 200 inside the chamber 110, and is reflected by the wafer 200 (①), and secondly, is transmitted through the upper dome 110u, is incident on the light receiving unit (②). Therefore, the laser beam LB may be transmitted through the upper dome 110u a total of two times.

As illustrated in FIG. 12B, a laser beam LB may be obliquely incident on the upper dome 110c, and thus the influence of laser beam reflected back on a surface of the upper dome 110c may be reduced and the by-products BP of a transparent material may be effectively detected. Further, as the laser beam LB is obliquely incident on the upper dome 110c, a path of the by-products BP through which the laser beam LB is transmitted and passes may be elongated, and the intensity of the laser beam LB may be further reduced due to the oblique incidence of the laser beam LB into the by-products BP. For example, when the laser beam LB is incident on the surface of the upper dome 110c with a second acute angle θ2, the thickness of the by-products BP through which the laser beam LB is transmitted may have a third thickness D3. The third thickness D3 may be greater than the thickness when the laser beam is perpendicularly incident on the upper dome 110c, for example, the first thickness D1 (see FIG. 7B).

Figure 13:
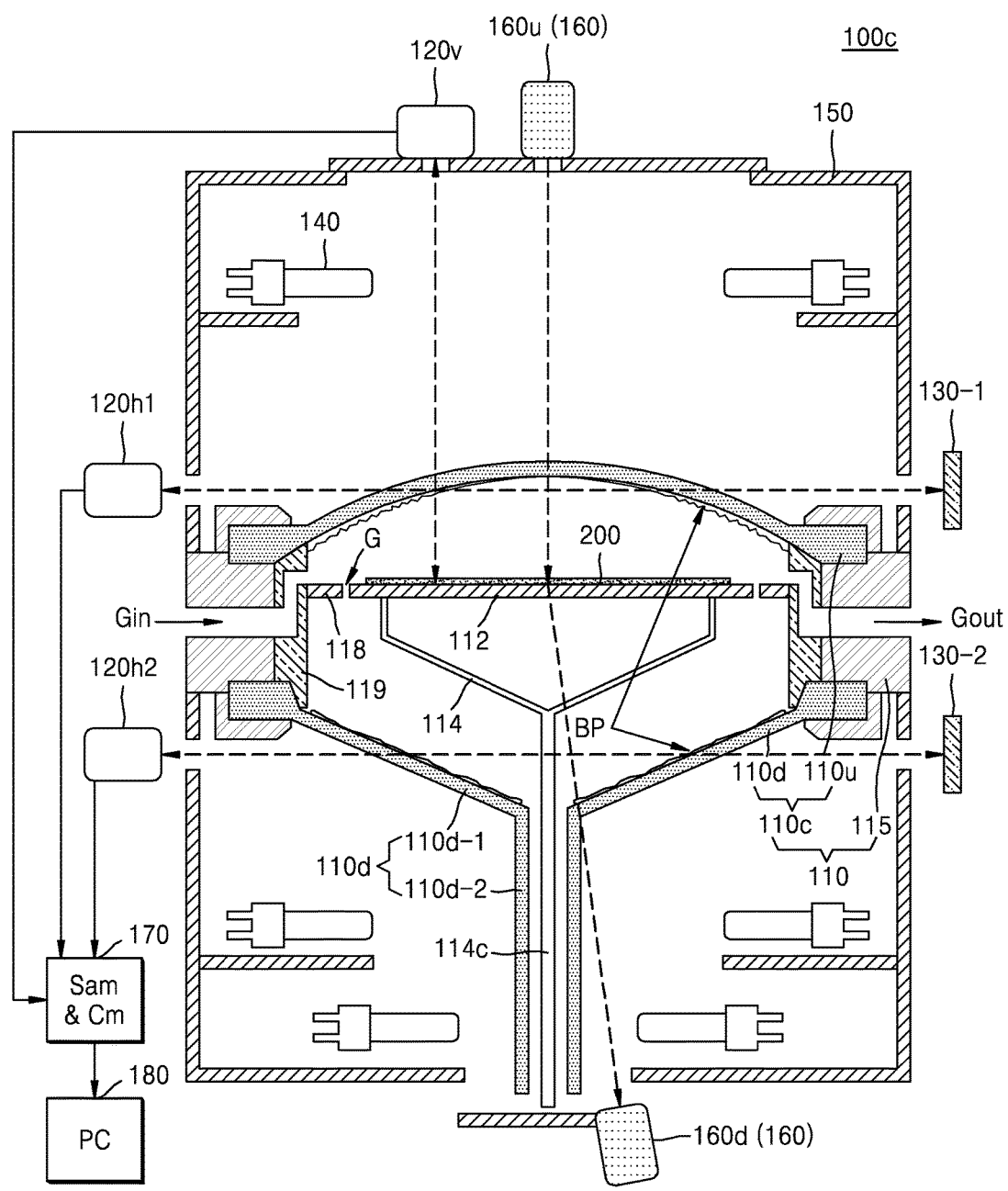
FIG. 13 is a cross-sectional view schematically illustrating a deposition process monitoring system according to one embodiment of the inventive concept.

FIG. 13 is a cross-sectional view schematically illustrating a deposition process monitoring system according to one embodiment of the inventive concept. Contents which have already been described in FIGS. 1 to 4B and 10 will be briefly described or omitted.

Referring to FIG. 13, a deposition process monitoring system 100c in the present embodiment may include two horizontal type laser sensors 120h1 and 120h2 and two reflection plates 130-1 and 130-2 corresponding thereto unlike the deposition process monitoring system 100b of FIG. 10. For example, the deposition process monitoring system 100c in the present embodiment may include a first horizontal type laser sensor 120h1, a second horizontal type laser sensor 120h2, a first reflection plate 130-1, and a second reflection plate 130-2. The first horizontal type laser sensor 120h1 and the first reflection plate 130-1 are the same as the laser sensor 120h and the reflection plate 130 described in FIG. 1.

The second horizontal type laser sensor 120h2 and the second reflection plate 130-2 may be disposed so that a laser beam is transmitted through the lower dome 110d. A structure of each of the second horizontal type laser sensor 120h2 and the second reflection plate 130-2, a laser beam detection principle, or the like are the same as those of the laser sensor 120h and the reflection plate 130 described in FIG. 1. Accordingly, IR filters and/or shutters may be disposed at portions of the facility cover 150 at which the second horizontal type laser sensor 120h2 and the second reflection plate 130-2 are disposed. The second reflection plate 130-2 may rotate a polarization direction of an incident laser beam by about 90° in a retro-reflective form. Polarizing filters having different characteristics may be disposed at front ends of a light emitting unit and a light receiving unit of the second horizontal type laser sensor 120h2.

As the deposition process monitoring system 100c in the present embodiment further includes the vertical type laser sensor 120v and the second horizontal type laser sensor 120h2, a state of the by-products BP with which the upper dome 110c is coated may be more accurately checked through the first horizontal type laser sensor 120h1 and the vertical type laser sensor 120v, and a state of the by-products BP with which the lower dome 110d is coated may also be checked through the second horizontal type laser sensor 120h2.

In the various embodiments of the deposition process monitoring systems, the laser sensors have been illustrated to have a structure in which the laser sensors are disposed at the side surfaces or the upper surfaces of the facility cover 150. However, the positions of the laser sensors are not limited thereto. For example, the laser sensors may be disposed below the facility cover 150 to be adjacent to the lower pyrometer 160d. Even though one or two laser sensors disposed at the side surface of the facility cover 150 and one laser sensor disposed at the upper surface of the facility cover 150 are illustrated, the number of the laser sensors is not limited thereto. For example, various numbers of laser sensors may be disposed at various positions of the facility cover 150 in order to more accurately check the state of the by-products BP with which the cover dome 110c is coated. For example, various elements illustrated in the various embodiments may be interchangeable with each other in their position and components. For example, one of the laser sensors using reflection plates may be substituted by a laser sensor operating without a reflection plate.

Figure 14:
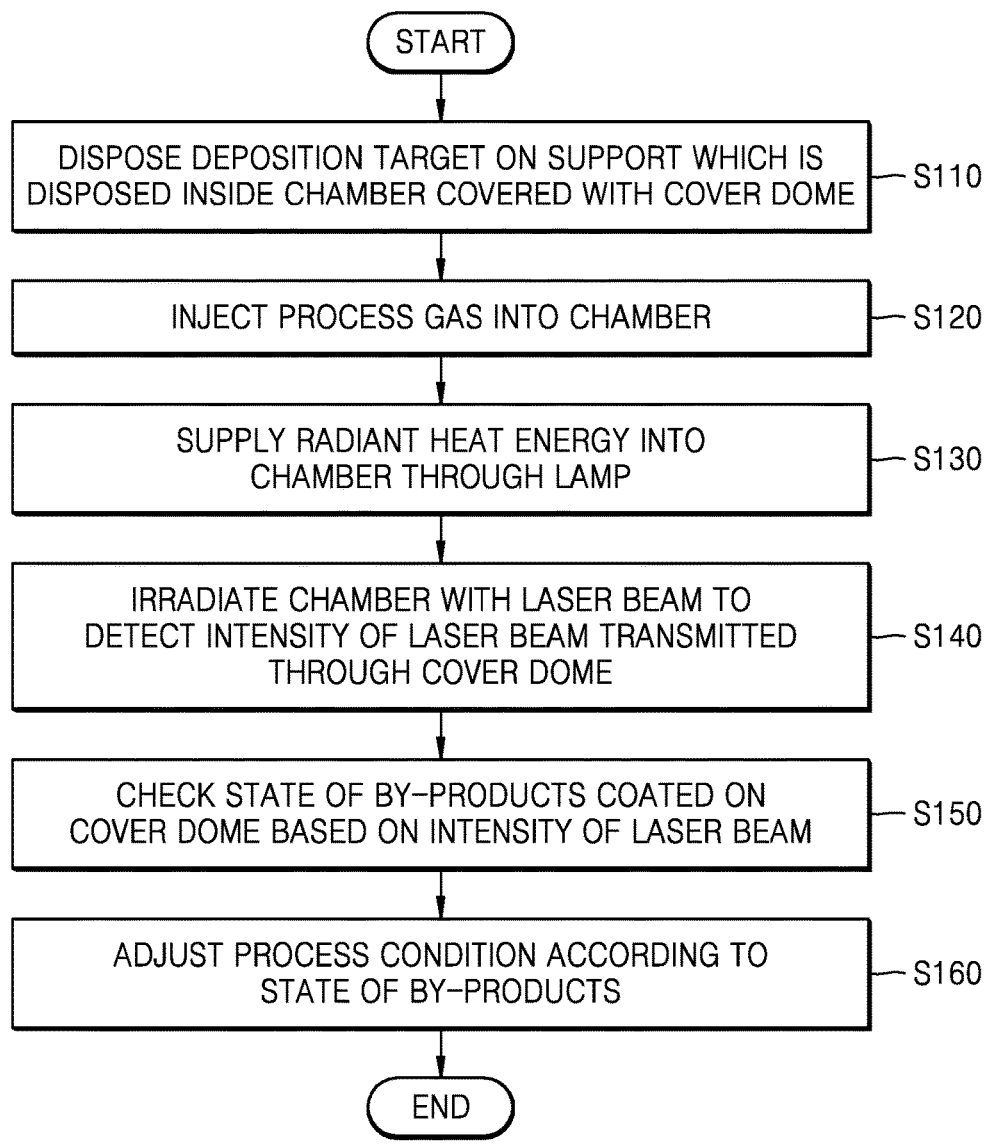
FIG. 14 is a flowchart illustrating a process of controlling a deposition process by monitoring an internal state of a chamber according to one embodiment of the inventive concept.

FIG. 14 is a flowchart illustrating a process of controlling a deposition process by monitoring an internal state of a chamber according to one embodiment of the inventive concept. For convenience of description, the process will be described with reference to FIG. 1.

Referring to FIG. 14, first, a deposition target 200 is disposed on a support 112 inside a chamber 110 (S110). The deposition target 200 may be, for example, a wafer. Of course, the deposition target is not limited to the wafer. The chamber 110 includes a cover dome 110c and a chamber body 115, and a closed reaction space may be defined therein. The cover dome 110c may be formed of a translucent material or a transparent material, for example, quartz.

A process gas is injected into the chamber 110 (S120). The process gas may be injected through a gas inlet Gin. The process gas may vary according to a material of a thin film to be formed on the wafer. For example, when a silicon thin film needs to be formed, the above-described silicon source gases may be injected as a process gas.

Radiant heat energy is supplied into the chamber 110 by lamps 140 (S130). Although the supply of the radiant heat energy and the injection of the process gas are separately described, the order of the supply of the radiant heat energy and the injection of the process gas may not be clearly distinguished. For example, the supply of the radiant heat energy and the injection of the process gas may be simultaneously performed, or one process may start to perform while the other process is already being performed.

For example, in a process of forming a silicon thin film, a hydrogen treatment may be performed first. As process conditions, a temperature is maintained in a range of about 700° C. to 900° C. while an UV lamp is turned on, and hydrogen gas flows into the chamber at a flow rate of about 10 slm to 150 slm for about 1 minute to 5 minutes. Then, $SiCl_2H_2+HCl+H_2$ is provided as process gas, the temperature is maintained at a range of about 700° C. to 900° C., the pressure is set to a range of about 5 Torr to 150 Torr, and the process proceeds. In this case, $SiCl_2H_2$ gas may flow into the chamber at a range of about 0.05 slm to 2 slm, HCl gas may flow into the chamber at a range of about 0 slm to 3 slm, $H_2$ gas may flow into the chamber at a range of about 10 slm to 150 slm, and a doping gas such as $PH_3$, $AsH_3$, or $B_2H_6$ may be provided in-situ. Of course, process conditions in the process of forming the silicon thin film are not limited to the kinds of above process gases and the ranges of values.

A laser beam is emitted into the chamber, and an intensity of the laser beam transmitted through the cover dome 110c is detected (S140). The laser beam is emitted from the laser sensor 120h, is reflected by a reflection plate 130, is received by the laser sensor 120h again, and thus the intensity of the laser beam transmitted through the cover dome 110c may be detected. This laser beam detection process may be performed during the deposition process or between the deposition processes.

The state of the by-products with which the cover dome is coated may be determined based on the intensity of the laser beam (S150). For example, whether a state of by-products BP is within an allowable range may be determined according to the detected intensity of the laser beam. A more detailed description of determining the state of the by-products BP is the same as the descriptions above with respect to the analysis and control computer 180.

The process conditions are adjusted according to the intensity of the laser beam or the state of the by-products BP (S160). The adjustment of the process conditions may include adjusting a temperature in the chamber by correcting or adjusting a temperature read by a pyrometer 160 and/or by adjusting the lamps. Detailed descriptions of the adjustment of the process conditions are the same as the above descriptions with respect to the analysis and control computer 180.

Figure 15:
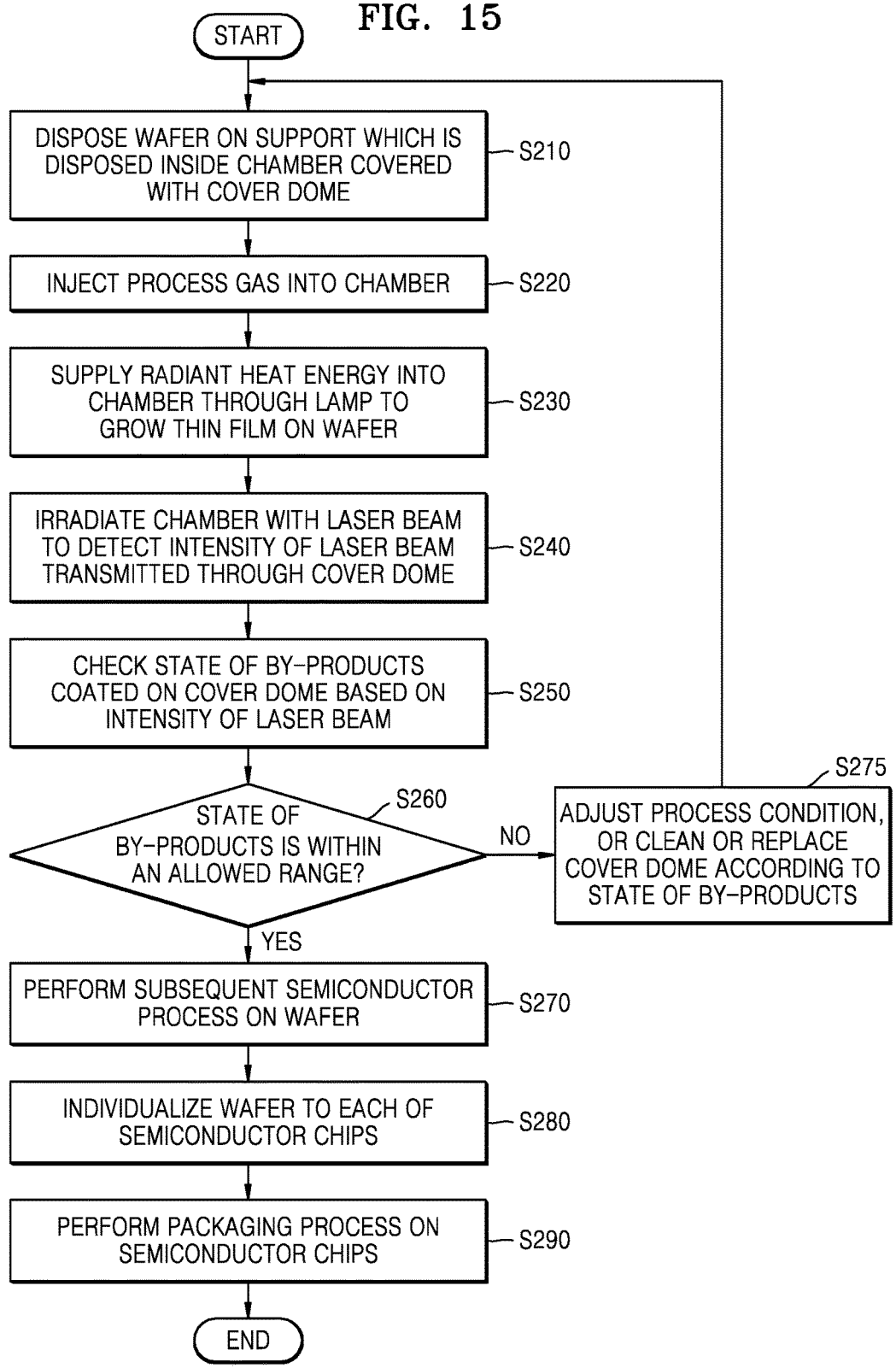
FIG. 15 is a flowchart illustrating a process of fabricating a semiconductor device by controlling a deposition process according to one embodiment of the inventive concept.

FIG. 15 is a flowchart illustrating a process of fabricating a semiconductor device by controlling a deposition process according to one embodiment of the inventive concept. For convenience of description, the process will be described with reference to FIG. 1. Further, contents which have already been described with respect to FIG. 14 will be briefly described or omitted.

Referring to FIG. 15, first, a wafer 200 is disposed on a support 112 inside a chamber 110 (S210), and a process gas is injected into the chamber 110 (S220). Further, radiant heat energy is supplied into the chamber 110 by lamps 140, and a thin film is grown on the wafer (S230). The injection of the process gas and the supply of the radiant heat energy may be simultaneously performed, or one process may start to perform while the other process is already being performed.

A laser beam is emitted into the chamber and an intensity of the laser beam transmitted through a cover dome 110c is detected (S240), and a state of by-products with which the cover dome is coated is determined based on the intensity of the laser beam (S250). The determining of the state of the by-products BP may include, for example, calculating or quantifying a thickness of the by-products BP according to the intensity of the laser beam. Whether the state of the by-products BP is within an allowable range is determined (S260). For example, whether the above-described thickness of the by-products BP calculated or quantified according to the intensity of the laser beam is within a preset allowable range is determined. The laser beam detection process may be performed during the deposition process or between the deposition processes.

When the thickness of the by-products BP is within the allowable range (YES), subsequent semiconductor processes are performed on the wafer (S270). The subsequent semiconductor processes performed on the wafer 200 may include various processes. For example, the subsequent semiconductor processes performed on the wafer 200 may include a deposition process, an etching process, an ion implantation process, a cleaning process, and the like. Here, the deposition process monitoring system in the present embodiment may be used in the deposition process. This process of fabricating a semiconductor device may include a plurality of deposition processes, and at least one of the deposition processes may be controlled by a deposition process monitoring system according to an embodiment described above. Integrated circuits or wirings in the corresponding semiconductor device may be formed by performing the subsequent semiconductor processes on the wafer 200. Subsequent semiconductor processes performed on the wafer may include a testing process performed on a wafer-level semiconductor device.

The wafer 200 is individualized into separate semiconductor chips (S280). The individualization into separate semiconductor chips may be performed through a sawing process using a blade or a laser.

Then, a packaging process is performed on the semiconductor chips (S290). The packaging process may be a process in which the semiconductor chips are mounted on a printed circuit board (PCB) and are sealed with a sealing material. The packaging process may include forming a stacked package in which a plurality of semiconductor chips are stacked on a PCB in a multiple-layer or forming a package on package (POP) structure in which another stacked package is stacked on the stacked package. The semiconductor device or the semiconductor package may be completed through the packaging process performed on the semiconductor chips. After the packaging process, a testing process may be performed on the semiconductor package.

When the state of the by-products BP is out of the allowable range (NO), the process conditions are adjusted or the cover dome 110c is cleaned or replaced with another cover dome according to the state of the by-products (S275). The adjustment of the process condition may include correcting a temperature of a pyrometer 160, or adjusting a temperature in the chamber by adjusting the lamps. For example, the state of the by-products BP may include multiple steps and/or multiple conditions involved therein. For example, one step of the state of the by-products BP may be a condition where the temperature of the pyrometer 160 needs to be adjusted. Another step of the state of the by-products BP may be a condition where the temperature in the chamber needs to be adjusted, e.g., by adjusting heat energy emitted from the lamps. Another step of the state of the by-products BP may be a condition where the by-products BP need to be removed from the cover dome, e.g., the cover dome needs to be cleaned to remove the by-products BP. In certain conditions, the cover dome may need to be replaced with another cover dome as discussed above. A more detailed description of the adjustment of the process conditions and the cleaning and replacement of the cover dome 110c is the same as the description of the analysis and control computer 180. After the adjustment of the process conditions and the like are performed, the process proceeds to a step of disposing a wafer on the support (S210).

The deposition process monitoring systems according to embodiments of the inventive concept include laser sensors, and thus can detect an intensity of a laser beam which is transmitted through a cover dome using the laser sensors in a deposition process. Further, a state of by-products with which the cover dome is coated can be checked based on the detected intensity of the laser beam. For example, a thickness of the by-products can be calculated based on the detected intensity of the laser beam.

For example, a deposition process monitoring system according to embodiments of the inventive concept may check the state of the by-products in real time, e.g., continuously or periodically, by detecting the intensity of the laser beam in the deposition process, and thus adjustment of a process condition, correction of a temperature of a pyrometer, determination of a cleaning time point and a cleaning method of the chamber, determination of a replacing time point of the cover dome, or the like in the deposition process may be performed accordingly. For example, the deposition process may be accurately controlled, times and costs of the deposition process may be reduced, a failure rate may be improved, and thus reliability and productivity of the semiconductor device may be improved.

While the invention has been described with reference to exemplary embodiments illustrated in accompanying drawings, these should be considered in a descriptive sense only, and it will be understood by those skilled in the art that various alterations and equivalent other embodiment may be made. Therefore, the scope of the invention is defined by the appended claims.

What is claimed is:

1. A method of manufacturing a semiconductor device, the method comprising:
   disposing a substrate on a support in a chamber of an apparatus;
   providing a gas into the chamber;
   forming a layer on the substrate with the gas;
   monitoring a by-product formed on a cover of the chamber; and
   adjusting the apparatus based on the monitored states of the by-product,
   wherein the chamber is disposed in a first cover,
   wherein the cover of the chamber is a transparent cover,
   wherein monitoring the by-product comprises:
      irradiating a first laser beam through the transparent cover of the chamber;
      receiving the first laser beam after the first laser beam is transmitted through the transparent cover at least two times; and
      determining a state of the by-product formed on the transparent cover based on the intensity of the received first laser beam.

2. The method of claim 1, wherein the by-product is a layer of material coated on the cover of the chamber.

3. The method of claim 2, wherein the state of the by-product is a thickness of the layer or a transmittance rate of the first laser beam through the by-product layer.

4. The method of claim 1, wherein the apparatus comprises:
   a first light emitter emitting the first laser beam onto the cover of the chamber;
   a first light receiver receiving the first laser beam transmitted through the cover of the chamber,
   a first polarizer disposed on the first light emitter; and
   a second polarizer disposed on the first light receiver,
   wherein the first and second polarizers have different polarization axes from each other.

5. The method of claim 4, wherein the apparatus further comprises
   a reflection plate disposed on a first side of the first cover,
   wherein the first light emitter is disposed on a second side of the first cover opposite the first side of the first cover,
   wherein the first laser beam is reflected on the reflection plate before being received by the first light receiver.

6. The method of claim 5, wherein the apparatus further comprises:
   a second light emitter emitting a second laser beam onto the cover of the chamber;
   a second light receiver receiving the second laser beam transmitted through the cover of the chamber;
   a third polarizer disposed on the second light emitter; and
   a fourth polarizer disposed on the second light receiver,
   wherein the second laser beam is reflected by the substrate before being received by the second light receiver, and
   wherein the third and fourth polarizers have different polarization axes from each other.

7. The method of claim 4, wherein the apparatus further comprises:
   a second light emitter emitting a second laser beam onto the cover of the chamber; and
   a second light receiver receiving the second laser beam transmitted through the cover of the chamber,
   wherein the second laser beam is reflected by the substrate before being received by the second light receiver.

8. The method of claim 1, wherein the adjusting the apparatus includes adjusting a temperature in the chamber by providing heat energy into the chamber.

9. The method of claim 1, wherein the adjusting the apparatus includes calibrating a thermometer detecting a temperature of the chamber.

10. The method of claim 9, wherein the thermometer is a pyrometer.

11. The method of claim 1, wherein the adjusting the apparatus includes removing by-products formed on the transparent cover of the chamber.

12. The method of claim 1, wherein the transparent cover of the chamber comprises a first cover portion and a second cover portion,
   wherein the support is disposed between the first cover portion and the second cover portion, the first cover portion being above the support and the second cover portion being below the support,
   wherein both the first cover portion and the second cover portion are transparent to visible light.

13. The method of claim 12, wherein the first cover portion has a dome shape which is upwardly convex, and
   wherein the second cover portion has a funnel shape including a conical portion.

14. The method of claim 1, wherein the apparatus comprises a lamp disposed inside the first cover and outside the chamber, the lamp supplying radiant heat into the chamber.

15. The method of claim 1, wherein the apparatus comprises a first light receiver receiving the first laser beam after the first laser beam is transmitted through the cover of the chamber four times.

16. A method of manufacturing a semiconductor device, the method comprising:
   disposing a substrate on a support in a chamber of an apparatus;
   providing a gas into the chamber;
   forming a layer on the substrate with the gas;
   monitoring a by-product formed on a cover of the chamber; and
   adjusting the apparatus based on the monitored states of the by-product,
   wherein the cover of the chamber is transparent,
   wherein monitoring the by-product comprises:

irradiating a first laser beam on the transparent cover of the chamber;

receiving the first laser beam transmitted through the transparent cover; and determining a state of the by-product formed on the transparent cover based on the intensity of the received first laser beam, and wherein the state of the by-product is determined by a transmittance rate of the first laser beam through the by-product.

17. The method of claim 16, wherein the receiving the first laser beam is performed after the first laser beam is transmitted through the cover of the chamber four times.

18. A method of manufacturing a semiconductor device, the method comprising:

disposing a substrate on a support in a chamber of an apparatus;

providing a gas into the chamber;

forming a layer on the substrate with the gas;

monitoring a by-product formed on a cover of the chamber; and adjusting the apparatus based on the monitored states of the by-product, wherein the cover of the chamber is transparent, wherein monitoring the by-product comprises:

irradiating a first laser beam on the transparent cover of the chamber;

receiving the first laser beam transmitted through the transparent cover; and determining a state of the by-product formed on the transparent cover based on the intensity of the received first laser beam, wherein the apparatus comprises:

a first light emitter emitting the first laser beam onto the cover of the chamber;

a first light receiver receiving the first laser beam transmitted through the cover of the chamber, a first polarizer disposed on the first light emitter; and a second polarizer disposed on the first light receiver, wherein the first and second polarizers have different polarization axes from each other.

19. The method of claim 18, wherein the apparatus further comprises a reflection plate disposed on a first side of the chamber, wherein the first light emitter is disposed on a second side of the chamber opposite the first side of the chamber, wherein the first laser beam is reflected on the reflection plate before being received by the first light receiver.

20. The method of claim 18, wherein the apparatus further comprises:

a second light emitter emitting a second laser beam onto the cover of the chamber; and a second light receiver receiving the second laser beam transmitted through the cover of the chamber, wherein the second laser beam is reflected by the substrate before being received by the second light receiver.

* * * * *